United States Patent
Pendse

(10) Patent No.: US 10,580,749 B2
(45) Date of Patent: *Mar. 3, 2020

(54) SEMICONDUCTOR DEVICE AND METHOD OF FORMING HIGH ROUTING DENSITY INTERCONNECT SITES ON SUBSTRATE

(71) Applicant: STATS ChipPAC, Ltd., Singapore (SG)

(72) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 490 days.

This patent is subject to a terminal disclaimer.

(21) Appl. No.: 14/329,162

(22) Filed: Jul. 11, 2014

(65) Prior Publication Data

US 2014/0319692 A1  Oct. 30, 2014

Related U.S. Application Data

(63) Continuation of application No. 12/961,027, filed on Dec. 6, 2010, now Pat. No. 8,841,779, which is a
(Continued)

(51) Int. Cl.
*H01L 21/00* (2006.01)
*H01L 23/00* (2006.01)
(Continued)

(52) U.S. Cl.
CPC ........... *H01L 24/17* (2013.01); *H01L 21/563* (2013.01); *H01L 23/49811* (2013.01);
(Continued)

(58) Field of Classification Search
CPC .......... H01L 24/17; H01L 24/97; H01L 24/09
See application file for complete search history.

(56) References Cited

U.S. PATENT DOCUMENTS

| 5,186,383 A | 2/1993 | Melton et al. |
| 5,340,435 A | 8/1994 | Ito et al. |

(Continued)

FOREIGN PATENT DOCUMENTS

| JP | 04-355933 | 9/1992 |
| JP | 2005-28037 | 4/1993 |

(Continued)

OTHER PUBLICATIONS

Appelt et al., "Fine Pitch Flip Chip Chip Scale Packaging", pp. 1-4, no date available.
(Continued)

*Primary Examiner* — Laura M Menz
(74) *Attorney, Agent, or Firm* — Robert D. Atkins; Patent Law Group: Atkins and Associates, P.C.

(57) ABSTRACT

A semiconductor device has a semiconductor die with a plurality of bumps formed over contact pads on a surface of the semiconductor die. The bumps can have a fusible portion and non-fusible portion. A plurality of conductive traces is formed over a substrate with interconnect sites having a width greater than 20% and less than 80% of a width of a contact interface between the bumps and contact pads. The bumps are bonded to the interconnect sites so that the bumps cover a top surface and side surface of the interconnect sites. An encapsulant is deposited around the bumps between the semiconductor die and substrate. The conductive traces have a pitch as determined by minimum spacing between adjacent conductive traces that can be placed on the substrate and the width of the interconnect site provides a routing density equal to the pitch of the conductive traces.

19 Claims, 27 Drawing Sheets

US 10,580,749 B2

Page 2

Related U.S. Application Data continuation-in-part of application No. 12/757,889, filed on Apr. 9, 2010, now Pat. No. 8,318,537, which is a continuation of application No. 11/388,755, filed on Mar. 24, 2006, now abandoned.

(60) Provisional application No. 60/665,208, filed on Mar. 25, 2005.

(51) Int. Cl.
  *H01L 23/498* (2006.01)
  *H05K 1/11* (2006.01)
  *H01L 21/56* (2006.01)
  H01L 25/065 (2006.01)
  H05K 3/34 (2006.01)

(52) U.S. Cl.
  CPC ........ *H01L 23/49838* (2013.01); *H01L 24/09* (2013.01); *H01L 24/11* (2013.01); *H01L 24/13* (2013.01); *H01L 24/16* (2013.01); *H01L 24/81* (2013.01); *H01L 24/97* (2013.01); *H05K 1/111* (2013.01); H01L 24/48 (2013.01); H01L 24/73 (2013.01); H01L 25/0657 (2013.01); H01L 2224/0401 (2013.01); H01L 2224/05557 (2013.01); H01L 2224/0901 (2013.01); H01L 2224/1134 (2013.01); H01L 2224/131 (2013.01); H01L 2224/1308 (2013.01); H01L 2224/13019 (2013.01); H01L 2224/13023 (2013.01); H01L 2224/13082 (2013.01); H01L 2224/13111 (2013.01); H01L 2224/13116 (2013.01); H01L 2224/13144 (2013.01); H01L 2224/13147 (2013.01); H01L 2224/13155 (2013.01); H01L 2224/16225 (2013.01); H01L 2224/16227 (2013.01); H01L 2224/16235 (2013.01); H01L 2224/16237 (2013.01); H01L 2224/16238 (2013.01); H01L 2224/17104 (2013.01); H01L 2224/32145 (2013.01); H01L 2224/32225 (2013.01); H01L 2224/48091 (2013.01); H01L 2224/48227 (2013.01); H01L 2224/73203 (2013.01); H01L 2224/73204 (2013.01); H01L 2224/73265 (2013.01); H01L 2224/8121 (2013.01); H01L 2224/81136 (2013.01); H01L 2224/81204 (2013.01); H01L 2224/81211 (2013.01); H01L 2224/81801 (2013.01); H01L 2224/81815 (2013.01); H01L 2224/83102 (2013.01); H01L 2224/83192 (2013.01); H01L 2224/83856 (2013.01); H01L 2224/92125 (2013.01); H01L 2224/97 (2013.01); H01L 2924/00013 (2013.01); H01L 2924/00014 (2013.01); H01L 2924/014 (2013.01); H01L 2924/01005 (2013.01); H01L 2924/0105 (2013.01); H01L 2924/01006 (2013.01); H01L 2924/01013 (2013.01); H01L 2924/01029 (2013.01); H01L 2924/01033 (2013.01); H01L 2924/01046 (2013.01); H01L 2924/01047 (2013.01); H01L 2924/01049 (2013.01); H01L 2924/01074 (2013.01); H01L 2924/01075 (2013.01); H01L 2924/01078 (2013.01); H01L 2924/01079 (2013.01); H01L 2924/01082 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/14 (2013.01); H01L 2924/1433 (2013.01); H01L 2924/15787 (2013.01); H01L 2924/181 (2013.01); H01L 2924/19041 (2013.01); *H01L 2924/3011* (2013.01); *H05K 3/3452* (2013.01); *H05K 2201/0989* (2013.01); *H05K 2201/09427* (2013.01); *H05K 2201/09727* (2013.01); *H05K 2201/10674* (2013.01); *Y02P 70/611* (2015.11)

(56) References Cited

U.S. PATENT DOCUMENTS

| | | | |
|---|---|---|---|
| 5,378,859 A | 1/1995 | Shirasaki et al. | |
| 5,383,916 A | 1/1995 | Brown | |
| 5,386,624 A | 2/1995 | George et al. | |
| 5,434,410 A | 7/1995 | Kulwicki | |
| 5,508,561 A | 4/1996 | Tago et al. | |
| 5,519,580 A | 5/1996 | Natarajan et al. | |
| 5,587,337 A | 12/1996 | Idaka et al. | |
| 5,650,595 A | 7/1997 | Bentlage et al. | |
| 5,710,071 A | 1/1998 | Beddingfield et al. | |
| 5,795,818 A | 8/1998 | Marrs | |
| 5,798,285 A | 8/1998 | Bentlage et al. | |
| 5,844,782 A | 12/1998 | Fukasawa | |
| 5,854,514 A | 12/1998 | Roldan et al. | |
| 5,869,886 A | 2/1999 | Tokuno | |
| 5,872,399 A | 2/1999 | Lee | |
| 5,889,326 A * | 3/1999 | Tanaka | H01L 24/11 257/737 |
| 5,915,169 A | 6/1999 | Heo | |
| 5,959,362 A | 9/1999 | Yoshino | |
| 5,985,456 A | 11/1999 | Zhou et al. | |
| 6,002,172 A | 12/1999 | Desai et al. | |
| 6,049,122 A | 4/2000 | Yoneda | |
| 6,109,507 A | 8/2000 | Yagi et al. | |
| 6,149,122 A | 11/2000 | Berger et al. | |
| 6,201,305 B1 | 3/2001 | Darveaux et al. | |
| 6,218,281 B1 * | 4/2001 | Watanabe | H01L 24/11 257/E21.508 |
| 6,218,630 B1 | 4/2001 | Takigami | |
| 6,228,466 B1 | 5/2001 | Tsukada et al. | |
| 6,229,209 B1 | 5/2001 | Nakamura et al. | |
| 6,229,220 B1 | 5/2001 | Saitoh et al. | |
| 6,229,711 B1 | 5/2001 | Yoneda | |
| 6,251,704 B1 | 6/2001 | Ohuchi et al. | |
| 6,259,159 B1 | 7/2001 | Dalal et al. | |
| 6,259,163 B1 | 7/2001 | Ohuchi et al. | |
| 6,281,107 B1 | 8/2001 | Moriyama | |
| 6,281,450 B1 | 8/2001 | Urasaki et al. | |
| 6,281,581 B1 | 8/2001 | Desai et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,333,206 B1 | 12/2001 | Ito et al. | |
| 6,335,568 B1 | 1/2002 | Yuzawa et al. | |
| 6,335,571 B1 | 1/2002 | Capote et al. | |
| 6,383,916 B1 | 5/2002 | Lin | |
| 6,396,707 B1 | 5/2002 | Huang et al. | |
| 6,409,073 B1 | 6/2002 | Kaskoun et al. | |
| 6,441,316 B1 | 8/2002 | Kusui | |
| 6,448,665 B1 | 9/2002 | Nakazawa et al. | |
| 6,458,622 B1 | 10/2002 | Keser et al. | |
| 6,459,622 B1 | 10/2002 | Ogura et al. | |
| 6,462,425 B1 * | 10/2002 | Iwasaki | H01L 21/563 257/780 |
| 6,472,608 B2 | 10/2002 | Nakayama | |
| 6,495,397 B2 | 12/2002 | Kubota et al. | |
| 6,510,976 B2 | 1/2003 | Hwee et al. | |
| 6,518,674 B2 | 2/2003 | Interrante et al. | |
| 6,518,678 B2 | 2/2003 | James et al. | |
| 6,550,666 B2 | 4/2003 | Chew et al. | |
| 6,556,268 B1 | 4/2003 | Lee et al. | |
| 6,563,712 B2 | 5/2003 | Akram et al. | |
| 6,573,610 B1 | 6/2003 | Tsai | |
| 6,578,754 B1 | 6/2003 | Tung | |
| 6,592,019 B2 | 7/2003 | Tung | |
| 6,600,234 B2 | 7/2003 | Kuwabara et al. | |
| 6,608,388 B2 | 8/2003 | Lin et al. | |
| 6,660,560 B2 | 12/2003 | Chaudhuri et al. | |
| 6,661,084 B1 | 12/2003 | Peterson et al. | |

(56) References Cited

U.S. PATENT DOCUMENTS

| | | | |
|---|---|---|---|
| 6,664,483 B2 | 12/2003 | Chong et al. | |
| 6,678,948 B1 * | 1/2004 | Benzler | H01L 24/16 |
| | | | 228/103 |
| 6,681,982 B2 | 1/2004 | Tung | |
| 6,710,458 B2 | 3/2004 | Seko | |
| 6,734,557 B2 | 5/2004 | Taniguchi et al. | |
| 6,768,190 B2 | 7/2004 | Yang et al. | |
| 6,774,474 B1 | 8/2004 | Caletka et al. | |
| 6,774,497 B1 | 8/2004 | Qi et al. | |
| 6,780,673 B2 | 8/2004 | Venkateswaran | |
| 6,780,682 B2 | 8/2004 | Pendse | |
| 6,787,918 B1 | 9/2004 | Tsai et al. | |
| 6,798,072 B2 | 9/2004 | Kajiwara et al. | |
| 6,809,262 B1 | 10/2004 | Hsu | |
| 6,818,545 B2 | 11/2004 | Lee et al. | |
| 6,821,878 B2 | 11/2004 | Danvir et al. | |
| 6,849,944 B2 | 2/2005 | Murtuza et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 6,927,489 B1 | 8/2005 | Yaguchi et al. | |
| 6,943,058 B2 | 9/2005 | Chaudhuri et al. | |
| 7,005,585 B2 | 2/2006 | Ishizaki | |
| 7,005,743 B2 | 2/2006 | Iwatsu et al. | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,101,781 B2 | 9/2006 | Ho et al. | |
| 7,102,222 B2 | 9/2006 | Kuo et al. | |
| 7,102,239 B2 | 9/2006 | Pu et al. | |
| 7,112,524 B2 | 9/2006 | Hsu et al. | |
| 7,164,208 B2 | 1/2007 | Kainou et al. | |
| 7,173,828 B2 | 2/2007 | Lin et al. | |
| 7,183,493 B2 | 2/2007 | Garcia et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,451 B2 | 11/2007 | Chiu et al. | |
| 7,294,457 B2 | 11/2007 | Kukolj et al. | |
| 7,294,929 B2 | 11/2007 | Miyazaki | |
| 7,317,245 B1 | 1/2008 | Lee et al. | |
| 7,361,990 B2 | 4/2008 | Lu et al. | |
| 7,405,484 B2 | 7/2008 | Usui et al. | |
| 7,436,063 B2 | 10/2008 | Miyata et al. | |
| 7,462,942 B2 | 12/2008 | Tan et al. | |
| 7,488,896 B2 | 2/2009 | Saiki et al. | |
| 7,521,284 B2 | 4/2009 | Miranda et al. | |
| 7,642,660 B2 | 1/2010 | Tay et al. | |
| 7,663,248 B2 | 2/2010 | Hedler et al. | |
| 7,663,250 B2 | 2/2010 | Jeon et al. | |
| 7,670,939 B2 | 3/2010 | Topacio et al. | |
| 7,671,454 B2 | 3/2010 | Seko | |
| 7,692,314 B2 | 4/2010 | Yang et al. | |
| 7,700,407 B2 | 4/2010 | Pendse | |
| 7,732,913 B2 | 6/2010 | Hsieh et al. | |
| 7,750,457 B2 | 7/2010 | Seko | |
| 7,790,509 B2 | 9/2010 | Gerber | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegos et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 7,973,406 B2 | 7/2011 | Pendse | |
| 8,026,128 B2 | 9/2011 | Pendse | |
| 8,129,841 B2 | 3/2012 | Pendse et al. | |
| 8,178,392 B2 | 5/2012 | Choi et al. | |
| 8,188,598 B2 | 5/2012 | Pendse | |
| 8,318,537 B2 | 11/2012 | Pendse | |
| 8,350,384 B2 * | 1/2013 | Pendse | H01L 21/563 |
| | | | 257/734 |
| 8,759,972 B2 | 6/2014 | Pendse | |
| 8,810,029 B2 * | 8/2014 | Pendse | H01L 21/563 |
| | | | 257/734 |
| 8,841,779 B2 * | 9/2014 | Pendse | H01L 21/563 |
| | | | 257/778 |
| 9,064,858 B2 * | 6/2015 | Pendse | H01L 21/563 |
| 9,159,665 B2 * | 10/2015 | Pendse | H01L 21/563 |
| 2001/0008309 A1 | 7/2001 | Iijima et al. | |
| 2001/0013423 A1 | 8/2001 | Dalal et al. | |
| 2002/0033412 A1 | 3/2002 | Tung | |
| 2002/0041036 A1 | 4/2002 | Smith | |
| 2002/0100610 A1 | 8/2002 | Yasuda et al. | |
| 2002/0121706 A1 | 9/2002 | Tatsuta et al. | |
| 2002/0155637 A1 | 10/2002 | Lee | |
| 2002/0179689 A1 | 12/2002 | Tung | |
| 2002/0192865 A1 | 12/2002 | Imasu et al. | |
| 2003/0049411 A1 | 3/2003 | Chaudhuri et al. | |
| 2003/0057551 A1 | 3/2003 | Datta et al. | |
| 2003/0067084 A1 | 4/2003 | Shintani | |
| 2003/0071352 A1 | 4/2003 | Ouchi et al. | |
| 2003/0116866 A1 | 6/2003 | Cher 'Khng et al. | |
| 2003/0127734 A1 | 7/2003 | Lee et al. | |
| 2003/0127747 A1 | 7/2003 | Kajiwara et al. | |
| 2003/0157792 A1 | 8/2003 | Tong et al. | |
| 2003/0168748 A1 | 9/2003 | Katagiri et al. | |
| 2003/0175146 A1 | 9/2003 | Yeh et al. | |
| 2004/0027788 A1 | 2/2004 | Chiu et al. | |
| 2004/0035909 A1 | 2/2004 | Yeh et al. | |
| 2004/0046263 A1 | 3/2004 | Harper et al. | |
| 2004/0046264 A1 | 3/2004 | Ho et al. | |
| 2004/0056341 A1 | 3/2004 | Endo et al. | |
| 2004/0105223 A1 | 6/2004 | Okada et al. | |
| 2004/0108135 A1 | 6/2004 | Ashida | |
| 2004/0126927 A1 | 7/2004 | Lin et al. | |
| 2004/0210122 A1 | 10/2004 | Sieburg | |
| 2004/0232560 A1 | 11/2004 | Su | |
| 2004/0232562 A1 | 11/2004 | Hortaleza et al. | |
| 2005/0046041 A1 | 3/2005 | Tsai | |
| 2005/0082654 A1 | 4/2005 | Humpston et al. | |
| 2005/0103516 A1 | 5/2005 | Kaneyuki | |
| 2005/0224991 A1 | 10/2005 | Yeo | |
| 2005/0248037 A1 | 11/2005 | Hung et al. | |
| 2006/0131758 A1 | 6/2006 | Dao | |
| 2006/0192294 A1 | 8/2006 | Lee | |
| 2006/0202331 A1 | 9/2006 | Hu | |
| 2006/0216860 A1 | 9/2006 | Pendse | |
| 2006/0255473 A1 | 11/2006 | Pendse | |
| 2007/0200234 A1 | 8/2007 | Gerber et al. | |
| 2007/0259514 A1 | 11/2007 | Otremba | |
| 2008/0088013 A1 | 4/2008 | Chew et al. | |
| 2008/0093749 A1 | 4/2008 | Gerber et al. | |
| 2008/0179740 A1 | 7/2008 | Liao | |
| 2008/0213941 A1 | 9/2008 | Pendse | |
| 2008/0277802 A1 | 11/2008 | Tsai et al. | |
| 2009/0045507 A1 | 2/2009 | Pendse et al. | |
| 2009/0057378 A1 | 3/2009 | Hwang et al. | |
| 2009/0108445 A1 | 4/2009 | Liang | |
| 2009/0114436 A1 | 5/2009 | Chen et al. | |
| 2009/0146303 A1 | 6/2009 | Kwon | |
| 2009/0152716 A1 | 6/2009 | Sohara | |
| 2009/0191329 A1 | 7/2009 | Wang | |
| 2009/0288866 A1 | 11/2009 | Tsai et al. | |
| 2009/0308647 A1 | 12/2009 | Liao | |
| 2010/0139965 A1 | 6/2010 | Wang et al. | |
| 2011/0049703 A1 | 3/2011 | Hsu et al. | |
| 2013/0214409 A1 | 8/2013 | Pagaila et al. | |
| 2013/0277830 A1 | 10/2013 | Yu et al. | |

FOREIGN PATENT DOCUMENTS

| | | |
|---|---|---|
| JP | 6503687 | 4/1994 |
| JP | 09-097791 | 8/1997 |
| JP | 10-256307 | 9/1998 |
| JP | 10-256315 | 9/1998 |
| JP | 11145176 | 5/1999 |
| JP | 11233571 | 8/1999 |
| JP | 11330162 | 11/1999 |

(56) References Cited

FOREIGN PATENT DOCUMENTS

| | | |
|---|---|---|
| JP | 2000-031204 | 1/2000 |
| JP | 2000-133667 | 12/2000 |
| JP | 2000-349194 | 12/2000 |
| JP | 2001156203 | 6/2001 |
| JP | 2001-332583 | 11/2001 |
| JP | 2001351945 | 12/2001 |
| JP | 2002270732 | 9/2002 |
| JP | 2004-221205 | 5/2004 |
| JP | 2004165283 | 6/2004 |
| JP | 2005109187 | 4/2005 |
| JP | 2005333166 | 12/2005 |
| KR | 199879438 | 10/1997 |
| KR | 200062333 | 6/1999 |
| SG | 100817 | 7/2004 |
| TW | 530398 B | 5/2003 |
| WO | 9306964 | 4/1993 |
| WO | 03071842 | 8/2001 |

OTHER PUBLICATIONS

Chen et al., "Advanced Flip-Chip Package Production Solution for 40nm/28nm Technology Nodes", International Electron Devices Meeting, pp. 768-771, IEEE 2010.

Gerber et al., "Next Generation Fine Pitch Cu Pillar Technology—Enabling Next Generation Silicon Nodes", Electronic Components and Technology Conference, pp. 612-618, 2011.

He et al., "All-Copper Chip-to-Substrate Interconnects Part II. Modeling and Design", Journal of the Electrochemical Society, 155(4):D314-D322, 2008.

Heinen, K. Gail et al., "Multichip Assembly with Flipped Integrated Circuits", IEEE Transactions on Components, Hybrids, and Manufactureing Technology, vol. 12 No. 4, 1989, pp. 650-657.

Kawahara, Toshimi, "SuperCSP", IEEE Transactions on Advanced Packaging, May 2000, pp. 215-219, vol. 23, No. 2.

Lau, John H. et al., "A New Thermal-Fatigue Life Prediction Model for Wafer Level Chip Scale Package (WLCSP) Solder Joints", Journal of Electronic Packaging, vol. 124, 2002, pp. 212-220.

Love, David et al., "Wire Interconnect Technology, A New High-Reliability Tight-Pitch Interconnect Technology", Karl Suss, 1999.

Lu, H. et al., "Predicting Optimal Process Conditions for Flip-Chip Assembly Using Copper Column Bumped Dies", Electronics Packaging Technology Conference, 2002, pp. 338-343.

Pendse et al., "Bon-on-Lead: A Novel Flip Chip Interconnection Technology for Fine Effective Pitch and High I/O Density", Electronic Components and Technology Conference, pp. 16-23, 2006.

Powell, D. O. et al., 'Flip-Chip on FR-4 Integrated Circuit Packaging, HBN Technology Products, 1993, pp. 182-186.

Schubert, A. et al.. "Numerical and Experimental Investigations of Large IC Flip Chip Attach", Electronic Components and Technology Conference, 2000, pp. 1338-1346.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Yamada, Hiroshi et al., "Advanced copper column based solder bump for flip-chip interconnection", International Symposium on Microelectronics, 1997, pp. 417-422, The British Library—"The world's knowledge".

* cited by examiner

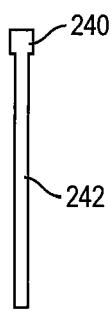 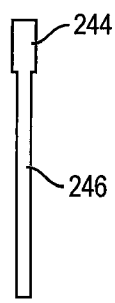 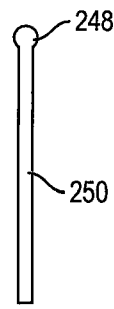 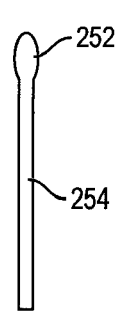 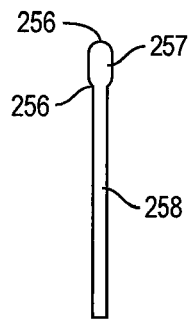
FIG. 16a    FIG. 16b    FIG. 16c    FIG. 16d    FIG. 16e
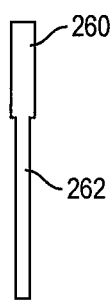 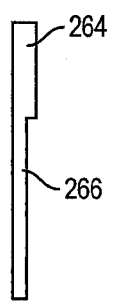 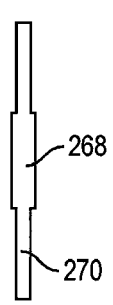
FIG. 17a    FIG. 17b    FIG. 17c
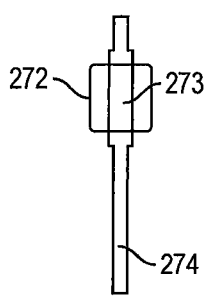 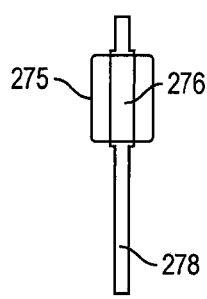
FIG. 18a    FIG. 18b

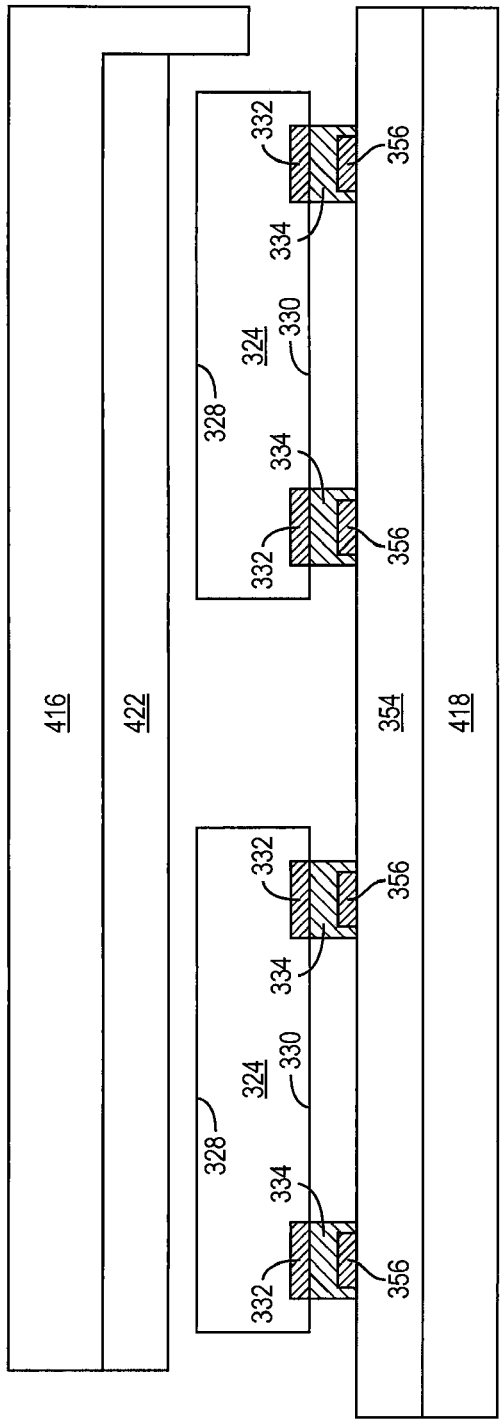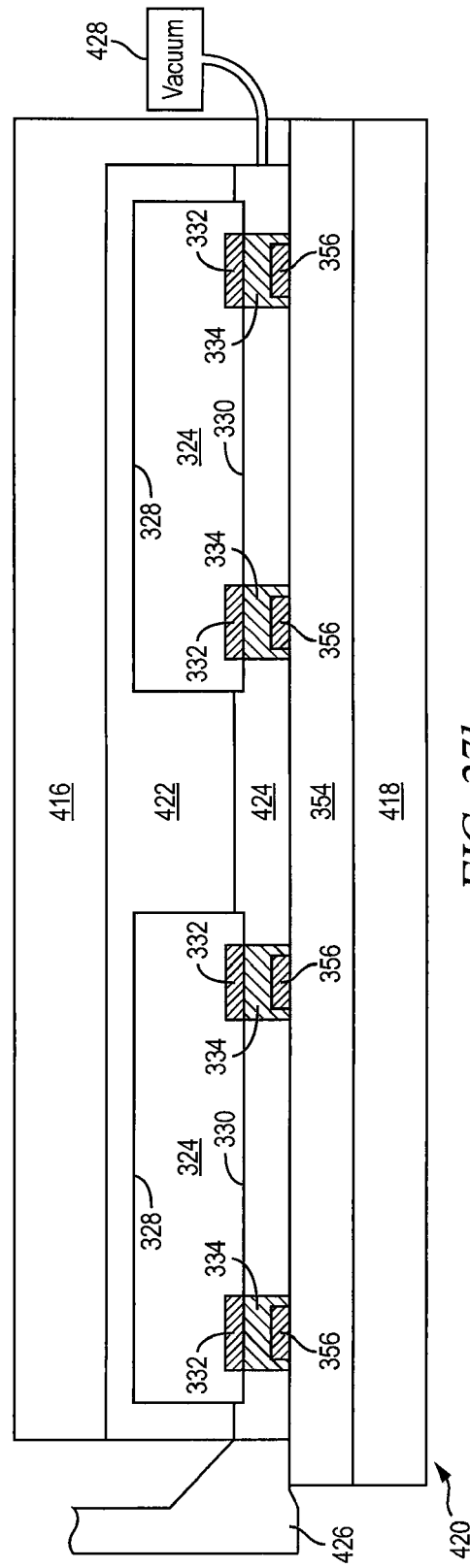

SEMICONDUCTOR DEVICE AND METHOD OF FORMING HIGH ROUTING DENSITY INTERCONNECT SITES ON SUBSTRATE

CLAIM TO DOMESTIC PRIORITY

The present application is a continuation of U.S. patent application Ser. No. 12/961,027, now U.S. Pat. No. 8,841,779, filed Dec. 6, 2010, which is a continuation-in-part of U.S. patent application Ser. No. 12/757,889, now U.S. Pat. No. 8,318,537, filed Apr. 9, 2010, which is a continuation of U.S. patent application Ser. No. 11/388,755, filed Mar. 24, 2006, now abandoned, which claims the benefit of U.S. Provisional Application No. 60/665,208, filed Mar. 25, 2005.

FIELD OF THE INVENTION

The present invention relates to semiconductor devices and, particularly, to a semiconductor device and method of forming high routing density interconnect sites on a substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In conventional flipchip type packages, a semiconductor die is mounted to a package substrate with the active side of the die facing the substrate. Conventionally, the interconnection of the circuitry in the semiconductor die with circuitry in the substrate is made by way of bumps which are attached to an array of interconnect pads on the die and bonded to a corresponding complementary array of interconnect pads, often referred to as capture pads on the substrate.

The areal density of electronic features on integrated circuits has increased enormously, and semiconductor die having a greater density of circuit features also may have a greater density of sites for interconnection with the package substrate.

The package is connected to underlying circuitry, such as a printed circuit board or motherboard, by way of second level interconnects between the package and underlying circuit. The second level interconnects have a greater pitch than the flipchip interconnects, and so the routing on the substrate conventionally fans out. Significant technological advances have enabled construction of fine lines and spaces. In the conventional arrangement, space between adjacent pads limits the number of traces that can escape from the more inward capture pads in the array. The fan-out routing between the capture pads beneath the semiconductor die and external pins of the package is conventionally formed on multiple metal layers within the package substrate. For a complex interconnect array, substrates having multiple layers can be required to achieve routing between the die pads and second level interconnects on the package.

Multiple layer substrates are expensive and, in conventional flipchip constructs, the substrate alone typically accounts for more than half the package cost. The high cost of multilayer substrates has been a factor in limiting proliferation of flipchip technology in mainstream products. In conventional flipchip constructs, the escape routing pattern typically introduces additional electrical parasitics because the routing includes short runs of unshielded wiring and vias between wiring layers in the signal transmission path. Electrical parasitics can significantly limit package performance.

The flipchip interconnection can be made by using a melting process to join the bumps, e.g., solder bumps, onto the mating surfaces of the corresponding capture pads, referred to as bump-on-capture pad (BOC) interconnect. Two features are evident in the BOC design: first, a comparatively large capture pad is required to mate with the bump on the semiconductor die, and second, an insulating material, typically a solder mask, is required to confine the flow of solder during the interconnection process. The solder mask opening defines the contour of the melted solder at the capture pad, i.e., solder mask defined, or the solder contour may not be defined by the mask opening, i.e., non-solder mask defined. In the latter case, the solder mask opening is significantly larger than the capture pad. Since the techniques for defining solder mask openings have wide tolerance ranges for a solder mask defined bump configuration, the capture pad must be large, typically considerably larger than the design size for the mask opening, to ensure that the mask opening will be located on the mating surface of the pad. The width of capture pads or diameter can be as much as two to four times wider than the trace width. The larger width of the capture pads results in considerable loss of routing space on the top substrate layer. In particular, the escape routing pitch is much larger than the finest trace pitch that the substrate technology can offer. A significant number of pads must be routed on lower substrate layers by means of short stubs and vias, often beneath the footprint of the die, emanating from the pads in question.

In a typical example of a conventional solder mask defined BOC interconnection, the capture pad has a diameter about 140 µm, and the solder mask opening has a diameter about 90 µm, and the routing traces are about 25-30 µm wide. The diameter of the mating surface for attachment of the bump to the die pad, that is, the place of interface between the bump and the die pad, is defined by the solder mask opening as having a diameter about 90 µm.

Some examples of conventional BOC interconnect layouts are shown in FIGS. 1 and 2 in portions 10 and 20 of a flipchip package. The partial sectional view in FIG. 1 is taken in a plane parallel to the package substrate surface, along the line 1-1' in FIG. 2. The partial sectional view in FIG. 2 is taken in a plane perpendicular to the package substrate surface, along the line 2-2' in FIG. 1. Certain features are shown as if transparent, but many of the features in FIG. 1 are shown partly obscured by overlying features.

A die attach surface of the package substrate includes a metal or layer formed on a dielectric layer over substrate 12. The metal layer is patterned to form traces or leads 13 and capture pads 14. An insulating layer or solder mask 16 covers the die attach surface of substrate 12. The solder mask 16 is usually made with a photo-definable material patterned by photoresist to leave the mating surfaces of capture pads 14 exposed. The interconnect bumps 15 attached to pads on the active side of semiconductor die 18 are joined to corresponding capture pads 14 on substrate 12 to form appropriate electrical interconnection between the circuitry on the die and the leads on the substrate. After the reflowed solder is cooled to establish the electrical connection, an underfill material 17 is introduced into the space between semiconductor die 18 and substrate 12 to mechanically stabilize the interconnects and protect the features between the die and substrate.

FIG. 1 shows signal escape traces 13 in the upper metal layer of substrate 12 routed from their respective capture pads 14 across the die edge location, indicated by broken line 11, and away from the die footprint. The signal traces 13 can have an escape pitch PE about 112 micrometers (µm). A 30 µm/30 µm design rule is typical for traces 13 in a configuration such as shown in FIG. 1. Traces 13 are nominally 30 µm wide and can be spaced as close together as 30 µm. The capture pads 14 are typically three times greater than the trace width, and the capture pads have a width or diameter nominally 90 µm. The openings in the solder mask are larger than the pads, having a nominal width or diameter of 135 µm.

FIGS. 1 and 2 show a non-solder mask defined solder contour. As the fusible material of the bumps on the die melt, the molten solder tends to wet the metal of the leads and capture pads, and the solder tends to run out over any contiguous metal surfaces that are not masked. The solder tends to flow along the contiguous lead 13, and here the solder flow is limited by the solder mask at location 19 in FIG. 1. A non-solder mask defined solder contour at the pad is apparent in FIG. 2, in which portion 29 of bumps 15 is shown as having flowed over the sides of capture pads 14 and down to the surface of the dielectric layer of substrate 12. The non-solder mask defined contour does not limit the flow of solder over the surface and down over the sides of the capture pads and, unless there is a substantial excess of solder at the pad, the flow of solder is limited by the fact that the dielectric surface of substrate 12 is typically not wettable by the molten solder. A lower limit on the density of the capture pads in the arrangement shown in FIG. 1 is determined by, among other factors, the capacity of the mask forming technology to make reliable narrow mask structures, and the need to provide mask structures between adjacent mask openings. A lower limit on the escape density is additionally determined by, among other factors, the need for escape lines from more centrally located capture pads to be routed between more peripherally located capture pads.

FIG. 3 shows a solder mask defined solder contour, in a sectional view similar to FIG. 2. Semiconductor die 38 is shown affixed by way of bumps 35 onto the mating surfaces of capture pads 34 formed along with traces or leads 33 by patterning a metal layer on the die attach side of a dielectric layer of substrate 32. After the reflowed solder is cooled to establish the electrical connection, an underfill material 37 is introduced into the space between die 38 and substrate 32 to mechanically stabilize the interconnects and protect the features between the die and substrate. Capture pads 34 are wider than in the examples of FIGS. 1 and 2, and the solder mask openings are smaller than the capture pads so that the solder mask material covers the sides and part of the mating surface of each capture pad, as shown at location 39, as well as leads 33. When bumps 35 are brought into contact with the mating surfaces of the respective capture pads 34, and then melted with solder mask material 36 restricting the flow of the molten solder so that the shapes of the solder contours are defined by the shapes and dimensions of the mask openings over capture pads 34.

SUMMARY OF THE INVENTION

A need exists to minimize the interconnect sites on a substrate to increase routing density without impacting electrical functionality or manufacturing reliability. Accordingly, in one embodiment, the present invention is a method of making a semiconductor device comprising the steps of providing a semiconductor component including a contact pad, providing a substrate including a conductive trace, and forming an interconnect structure between the contact pad and an interconnect site of the conductive trace. A width of the interconnect site is less than 80% of a width of a contact interface between the interconnect structure and the contact pad.

In another embodiment, the present invention is a method of making a semiconductor device comprising the steps of providing a first substrate, providing a second substrate including a conductive trace, and forming an interconnect structure between a contact pad on the first substrate and an interconnect site of the conductive trace. A width of the interconnect site is less than 80% of a width of a contact interface between the interconnect structure and the contact pad.

In another embodiment, the present invention is a semiconductor device comprising a semiconductor component and substrate including a conductive trace. An interconnect structure is formed between a contact pad of the semiconductor component and an interconnect site of the conductive trace. A width of the interconnect site is less than 80% of a width of a contact interface between the interconnect structure and the contact pad.

In another embodiment, the present invention is a semiconductor device comprising a first substrate and second substrate including a conductive trace. An interconnect structure is formed between a contact pad on the first substrate and an interconnect site of the conductive trace. A width of the interconnect site is less than 80% of a width of a contact interface between the interconnect structure and the contact pad.

BRIEF DESCRIPTION OF THE DRAWINGS

FIGS. 16a-16e illustrate various interconnect pad shapes;

FIGS. 17a-17c illustrate various interconnect pad configurations;

FIGS. 18a-18b illustrate various solder mask openings;

FIGS. 27a-27c illustrate mold underfill between the semiconductor die and substrate;

DETAILED DESCRIPTION OF THE DRAWINGS

Figure 1:
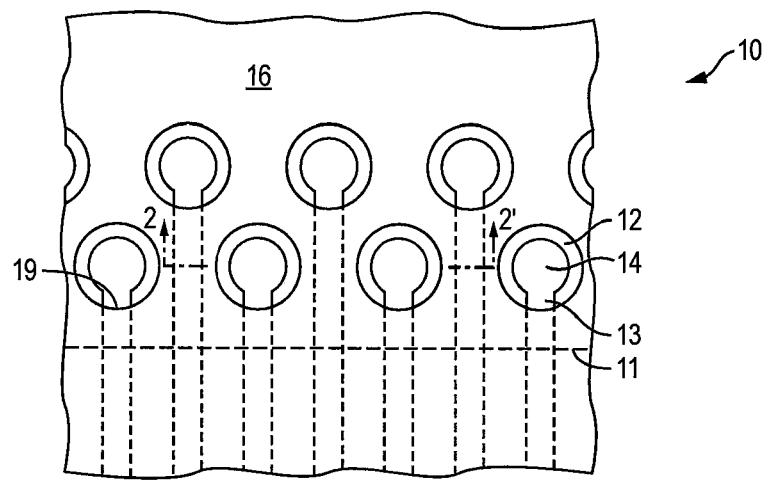
FIG. 1 illustrates a conventional bump-on-capture pad flipchip interconnection parallel to the plane of the package substrate surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as can be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
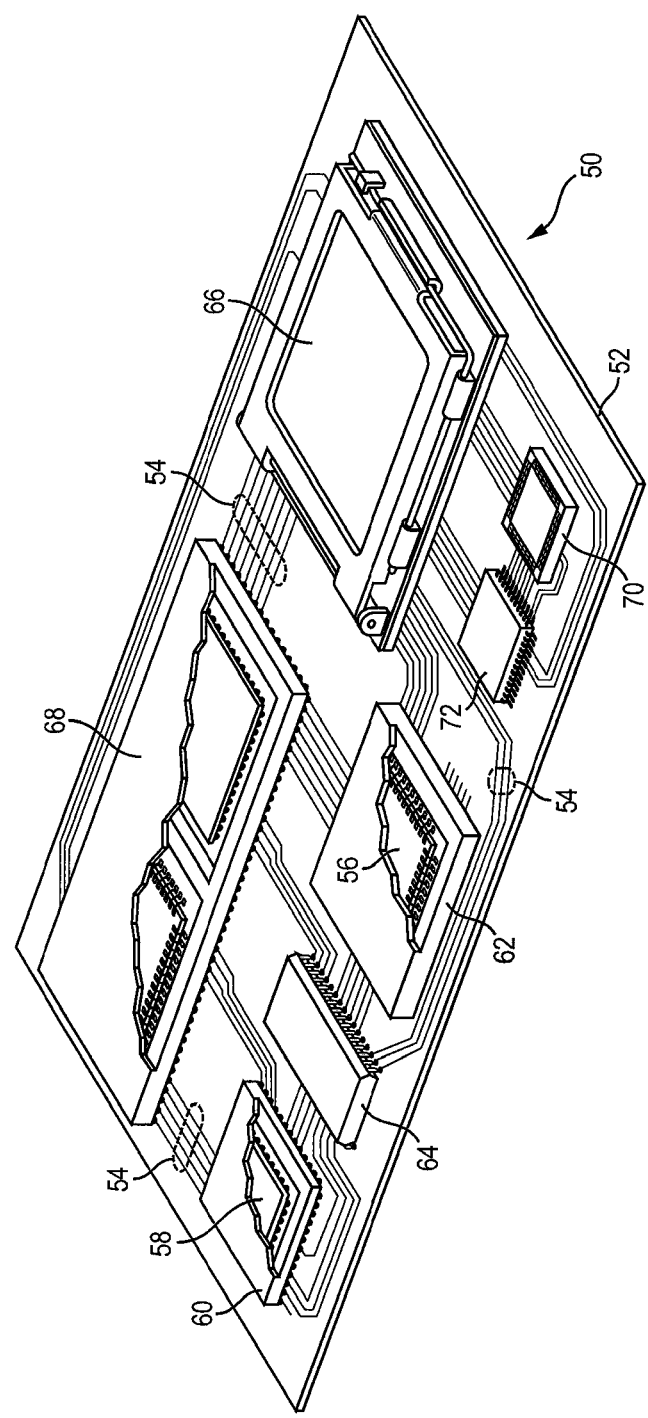
FIG. 4 illustrates a PCB with different types of packages mounted to its surface.

FIG. 4 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 4 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
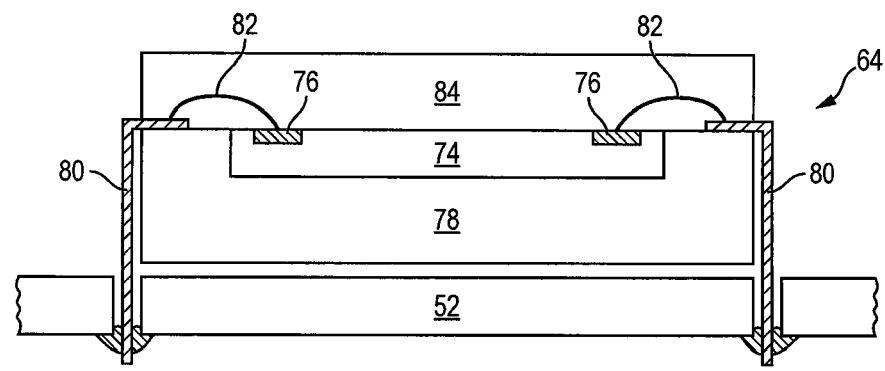
FIGS. 5a-5c illustrate further detail of the representative semiconductor packages mounted to the PCB.
Figure 5B:
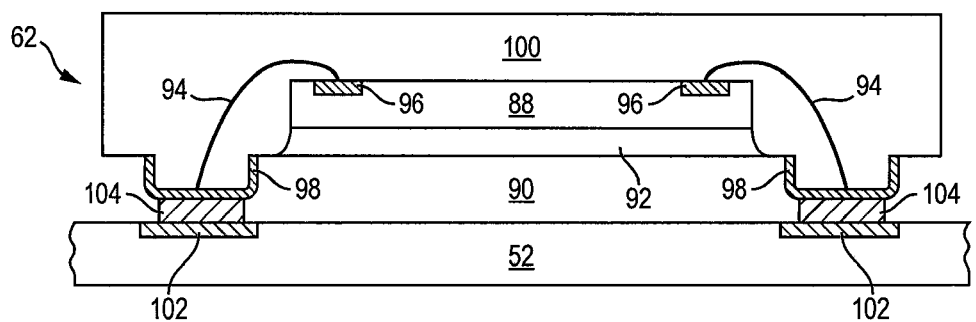
Figure 5C:
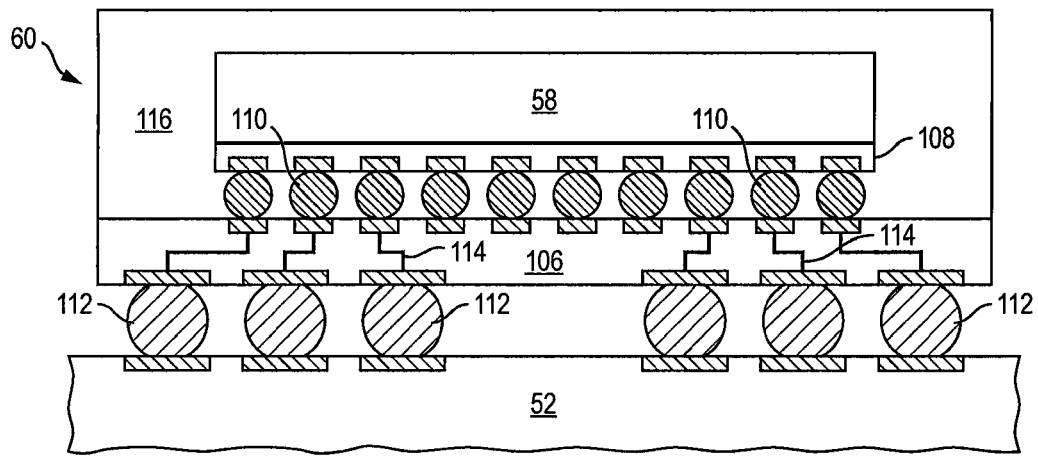

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 5b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

In a flipchip type semiconductor die, the interconnect is accomplished by connecting the interconnect bump directly onto a narrow interconnection pad, rather than onto a conventional capture pad. The width of the narrow pad is selected according to the base diameter of the interconnect bump that is to be connected onto the narrow pad. Particularly, the width of the narrow pad is less than the base diameter of the interconnect bump, e.g., in a range about 20% to about 80%. The present flipchip interconnect provides more efficient routing of traces on the substrate. The signal routing can be formed entirely in a single metal layer of the substrate to reduce the number of layers in the substrate. Forming the signal traces in a single layer permits relaxation of some of the via, line, and space design rules that the substrate must meet. The simplification of the substrate greatly reduces the overall cost of the flipchip package. The bump-on-narrow-pad (BONP) architecture also helps eliminate such features as vias and stubs from the substrate design and enables a microstrip controlled impedance electrical environment for signal transmission, thereby improving performance.

The flipchip interconnection has bumps attached to interconnect pads on a semiconductor die and mated onto corresponding narrow interconnection pads on a substrate. A flipchip package includes a semiconductor die having bumps attached to interconnect pads in an active surface, and a substrate having narrow interconnection pads in a die attach surface, in which the bumps are mated onto the narrow pads. The BONP interconnection can be formed without use of a solder mask to confine the molten solder during a re-melt stage in the process which allows for finer interconnection geometry.

Figure 6:
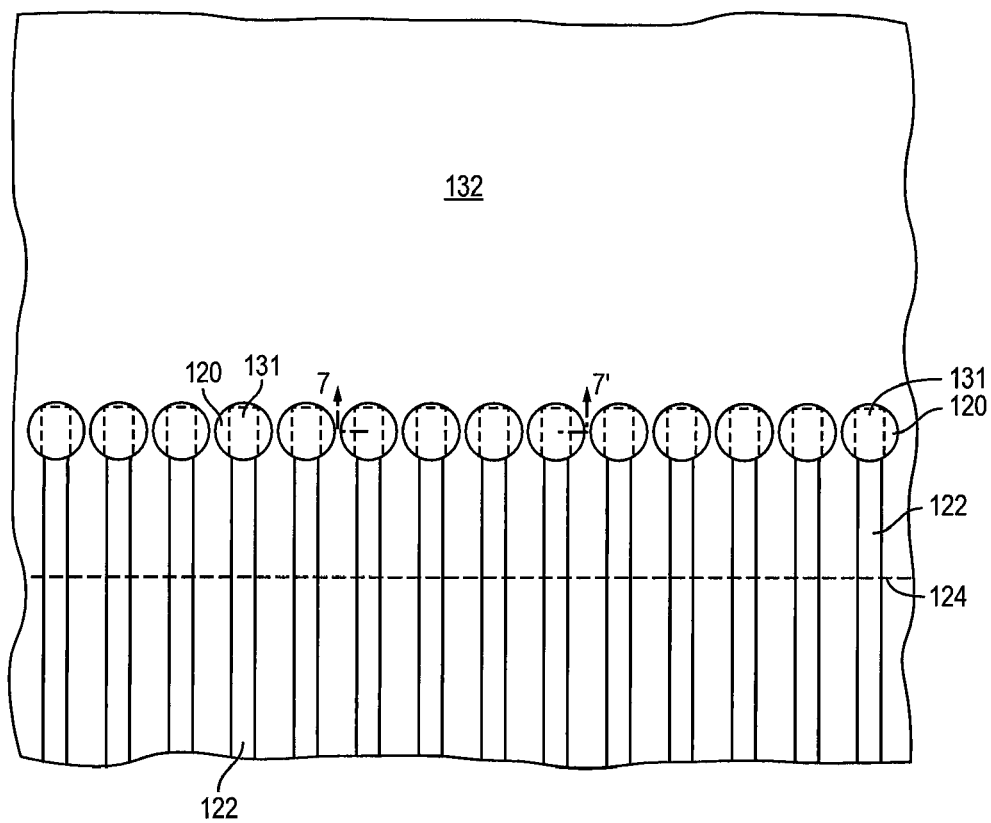
FIG. 6 illustrates a BONP flipchip interconnection parallel to the plane of the package substrate surface.
Figure 7:
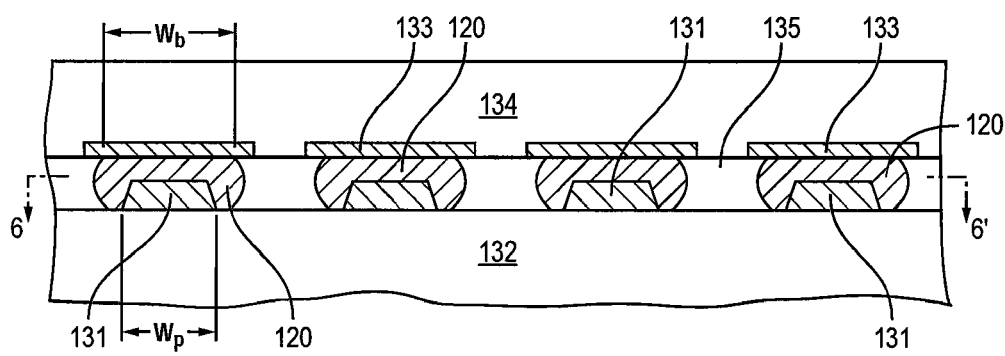
FIG. 7 illustrates the BONP flipchip interconnection of FIG. 6 perpendicular to the plane of the package substrate surface.
Figure 8:
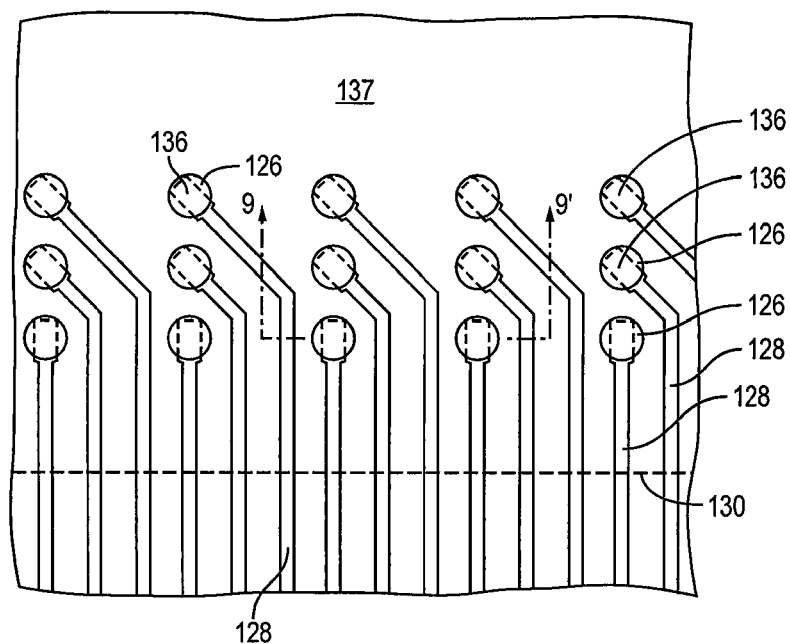
FIG. 8 illustrates a second BONP flipchip interconnection parallel to the plane of the package substrate surface.
Figure 9:
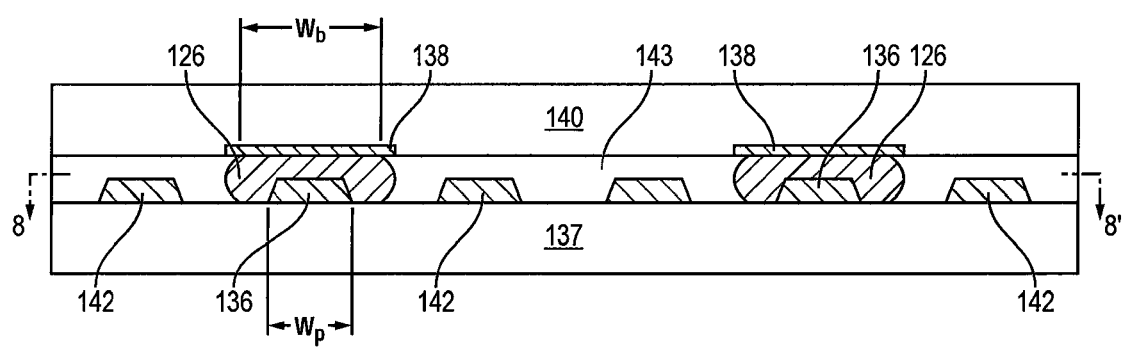
FIG. 9 illustrates the BONP flipchip interconnection of FIG. 8 perpendicular to the plane of the package substrate surface.

FIGS. 6 and 8 each show a portion of a BONP flipchip interconnection, in a diagrammatic partial sectional view taken in a plane parallel to the substrate surface, along the lines 6-6' and 8-8' in FIGS. 7 and 9, respectively. Certain features are shown as if transparent. The interconnection is achieved by mating the bumps onto respective narrow interconnection pads on the substrate. In this embodiment, the function of confining molten flow is accomplished without a solder mask in the course of the assembly process, as described below. FIG. 7 shows a partial sectional view of a package as in FIG. 6, taken in a plane perpendicular to the plane of the package substrate surface, along the line 7-7' in FIG. 6. FIG. 9 shows a partial sectional view of a package as in FIG. 8, taken in a plane perpendicular to the plane of the package substrate surface, along the line 9-9' in FIG. 8.

The escape routing patterns for BONP substrates are shown in FIGS. 6 and 8. In FIG. 6, the routing patterns are arranged for a semiconductor die on which the die attach pads for the interconnect balls are formed in a row near the die perimeter. Bumps 120 are mated onto corresponding narrow interconnection pads on escape traces 122 in a row near the edge of the die footprint, indicated by broken line 124. In FIG. 8, the routing patterns are arranged for a semiconductor die on which the die attach pads are in an array of parallel rows near the die perimeter. Bumps 126 are mated onto corresponding narrow interconnection pads on escape traces 128 in a complementary array near the edge of the die footprint, indicated by broken line 130.

Figure 2:
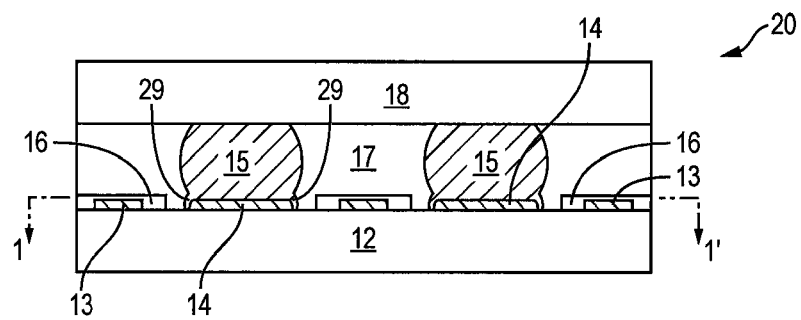
FIG. 2 illustrates a conventional bump-on-capture pad flipchip interconnection perpendicular to the plane of the package substrate surface.
Figure 3:
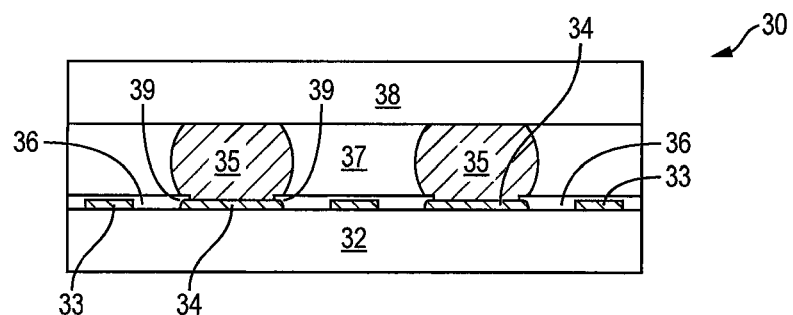
FIG. 3 illustrates another conventional bump-on-capture pad flipchip interconnection perpendicular to the plane of the package substrate surface.

In FIGS. 6 and 8, the routing density achievable using a BONP interconnect can equal the finest trace pitch offered by the substrate technology. In one embodiment, a width of the interconnect site on the trace can be up to 1.2 times a width of the trace. The conductive traces have a pitch as determined by minimum spacing between adjacent conductive traces that can be placed on the substrate and the width of the interconnect site provides a routing density equal to the pitch of the conductive traces. The routing density is significantly higher than is achieved in a conventional BOC arrangement, as described in FIGS. 1-3. Conventional capture pads are typically two to four times as wide as the trace or lead width.

As FIGS. 6 and 8 illustrate, the BONP interconnect can provide a significantly higher signal trace escape routing density. In FIG. 6, bumps 120 are placed at a fine pitch, which can equal the finest trace pitch of the substrate. The arrangement poses a challenge for the assembly process because the bumping and bonding pitch must be very fine. In FIG. 8, bumps 126 are arranged on an area array providing greater space for a larger bumping and bonding pitch and relieving the technological challenges for the assembly process. Even in the array embodiments, the routing traces on the substrate have the same effective pitch as in the perimeter row arrangement, which relieves the burden of fine pitch bumping and bonding without sacrificing the fine escape routing pitch advantage.

FIGS. 6 and 7 show traces or leads 122 and narrow interconnection pads 131 are formed by patterning a metal layer on a die attach surface of substrate dielectric layer 132. The narrow pads 131 can be formed as a widening of traces 122 at the interconnection sites. The width of an interconnection pad $W_p$ is the nominal or design dimension across the widened part of the trace at the interconnection site. The width of the narrow interconnection pad on the substrate is established according to the bump base width or base diameter of the bumps on the semiconductor die that is to be connected to the substrate. The bump base width $W_b$ is the nominal or design diameter of the generally round or circular contact interface between bump 120 and die pad 133. The diameter of the bump, taken in a plane parallel to the bump-pad interface, can be greater than $W_b$, as illustrated in FIGS. 7 and 9. The interconnection pad width $W_p$ is smaller than the bump base width $W_b$, e.g., $W_p$ can be as small as 20% of $W_b$. In other embodiments, $W_p$ is in a range about 20% to about 80% of $W_b$, or $W_p$ is less than $W_b$ and greater than about 25% of $W_b$, or $W_p$ is less than about 60% of $W_b$.

The electrical interconnection of semiconductor die 134 is made by joining bumps 120 onto the narrow interconnection pads 131 on leads 122. A narrow interconnection pad has a nominal or design width about 120% of the nominal or trace design rule width, and bump-on-narrow-lead (BONL) interconnection includes bumps connected to widened parts of traces that are greater than about 120% of the nominal or trace design rule width and less than the bump base diameter. The interconnection made with bumps bonded to portions of leads that are less than about 120% of the nominal or trace design rule width is referred to as a bump-on-lead (BOL) interconnection.

FIGS. 8 and 9 show signal escape traces or leads 128 and narrow interconnection pads 136 formed by patterning a metal layer on a die attach surface of substrate dielectric layer 137. The signal escape traces 128 are routed across the die edge location, indicated by broken line 130, and away from the die footprint. The narrow pads 136 can be formed as a widening of traces 128 at the interconnection sites. The width of an interconnection pad $W_p$ is the nominal or design dimension across the widened part of the trace at the interconnection site. The width of the narrow interconnection pad on a substrate is established according to the bump base width of the bumps on the die that is to be connected to the substrate. The bump base width $W_b$ is the nominal or design diameter of the generally round or circular contact interface between bump 126 and die pad 138. The interconnection pad width $W_p$ is smaller than the bump base width $W_b$, and $W_p$ can be as small as 20% of $W_b$. In other embodiments, $W_p$ is in a range about 20% to about 80% of $W_b$, or $W_p$ is less than $W_b$ and greater than about 25% of $W_b$, $W_p$ is less than about 60% of $W_b$.

The electrical interconnection of semiconductor die 140 is made by joining bumps 126 on the narrow interconnection pads 126 on leads 128. Certain of the escape traces 142 leading across the die edge location from interconnect sites in rows toward the interior of the die footprint pass between bumps 126 on more peripheral rows of interconnect sites. In embodiments as in FIGS. 6-9, no capture pads and no solder mask is required.

Figure 10:
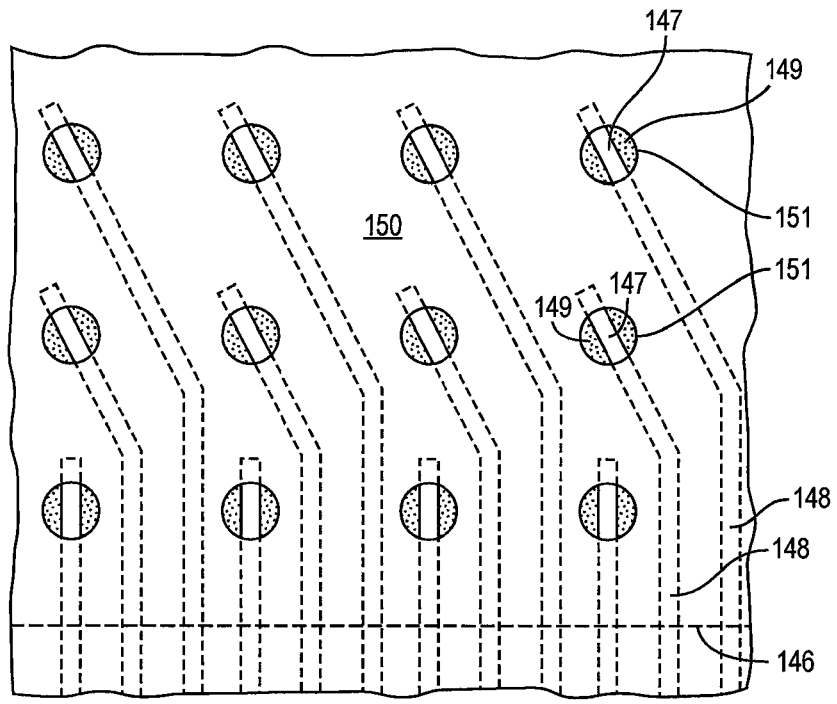
FIG. 10 illustrates a third BONP flipchip interconnection parallel to the plane of the package substrate surface.
Figure 11:
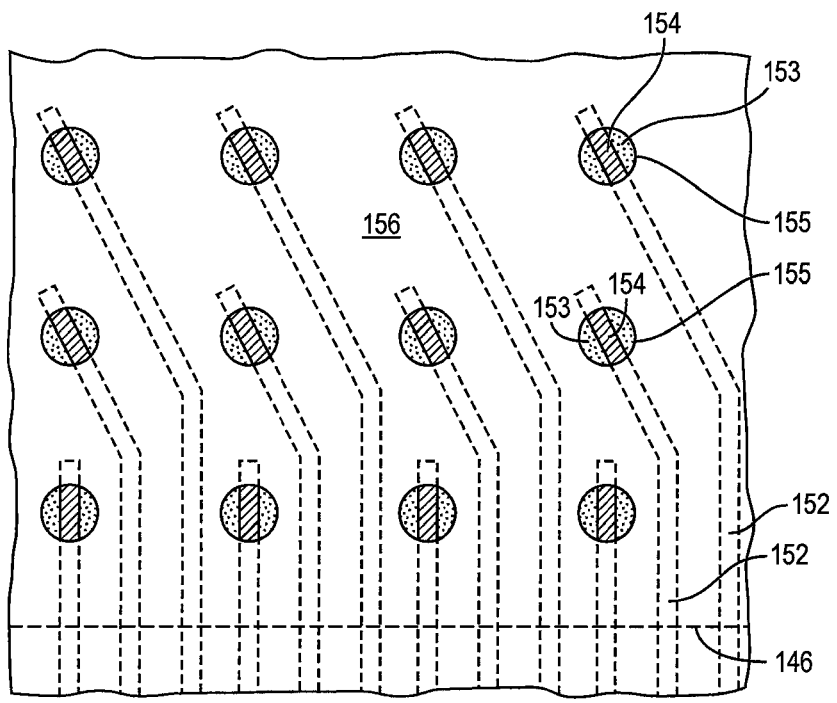
FIG. 11 illustrates a third BONP flipchip interconnection parallel to the plane of the package substrate surface.

FIGS. 10 and 11 show two examples of a BOL flipchip interconnection, in a diagrammatic sectional view taken in a plane parallel to the substrate surface. Certain features are shown as if transparent. In this embodiment, a solder mask is provided, which can have a nominal mask opening diameter in the range about 80 μm to 90 μm. Solder mask materials can be resolved at such pitches and, particularly, substrates can be made comparatively inexpensively with solder masks having 90 μm openings and having alignment tolerances plus or minus 25 μm. In some embodiments laminate substrates made according to standard design rules, such as 4-metal layer laminates, are used. The traces can be about 90 μm pitch and the narrow pads are arranged in a 270 μm area array providing an effective escape pitch about 90 μm across the edge of the die footprint, indicated by broken line 146.

In FIG. 10, the interconnection is achieved by mating the bumps directly onto an narrow interconnect pad 147 on a narrow lead or trace 148 patterned on a dielectric layer on the die attach surface of substrate 149. Solder mask 150 serves to limit flow of solder within the bounds of mask openings 151, preventing solder flow away from the interconnect site along the solder-wettable lead. The solder mask can additionally confine flow of molten solder between leads, which can be accomplished in the course of the assembly process.

In FIG. 11, narrow pads 154 on traces 152 are patterned on a dielectric layer on the die attach surface of substrate 153. Solder paste is provided at interconnect sites 154 on leads 152 to provide a fusible medium for the interconnect. The openings 155 in solder mask 156 serve to define the paste. The paste is dispensed, reflowed, and coined if necessary to provide uniform surfaces to meet the bumps. The solder paste can be applied in the course of assembly using a substrate as described above with reference to FIG. 10. Alternatively, a substrate can be provided with paste suitably patterned prior to assembly. Other approaches to applying solder selectively to the interconnect sites can be employed in the solder-on-narrow-pad, including electroless plating and electroplating techniques. The solder-on-narrow-pad configuration provides additional solder volume for the interconnect, and can accordingly provide higher product yield, and can also provide a higher die standoff. A capillary underfill can be employed.

Accordingly, in some embodiments the solder-on-narrow-pad configuration is employed for interconnection of a semiconductor die having high-melting temperature bumps, such as a high lead solder used for interconnection with ceramic substrates, onto an organic substrate. The solder paste can be selected to have a melting temperature low enough that the organic substrate is not damaged during reflow. To form the interconnect in such embodiments, the high-melting interconnect bumps are contacted with the solder-on-narrow-pad sites, and the remelt fuses the solder-on-narrow-pad to the bumps. Where a noncollapsible bump is used, together with a solder-on-narrow-pad process, no preapplied adhesive is required, as the displacement or flow of the solder is limited by the fact that only a small quantity of solder is present at each interconnect. The non-collapsible bump prevents collapse of the assembly. In other embodiments, the solder-on-narrow-pad configuration is employed for interconnection of a semiconductor die having eutectic solder bumps.

The flipchip interconnection can be formed by providing a substrate having narrow interconnection pads formed in a die attach surface and a semiconductor die having bumps attached to interconnect pads in an active surface, supporting the substrate and the die, dispensing a quantity of a curable adhesive on the substrate covering the narrow interconnection pads or on the active side of the die, positioning the die with the active side of the die toward the die attach surface of the substrate, aligning the die and substrate and moving one toward the other so that the bumps contact the corresponding narrow interconnection pads on the substrate, applying a force to press the bumps onto the mating narrow pads, sufficient to displace the adhesive from between the bump and the mating narrow pad. The adhesive is partially cured. The solder is melted and then re-solidified to form a metallurgical interconnection between the bump and the narrow pad.

Figure 12A:
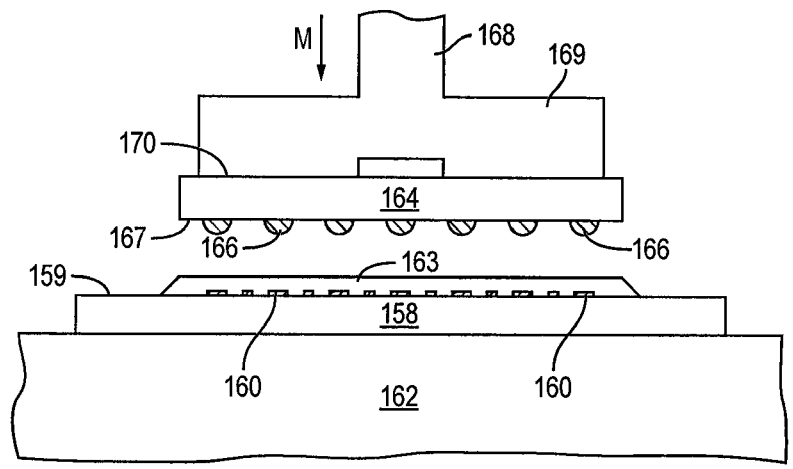
FIGS. 12a-12c illustrate a process for making a flipchip interconnection.
Figure 12B:
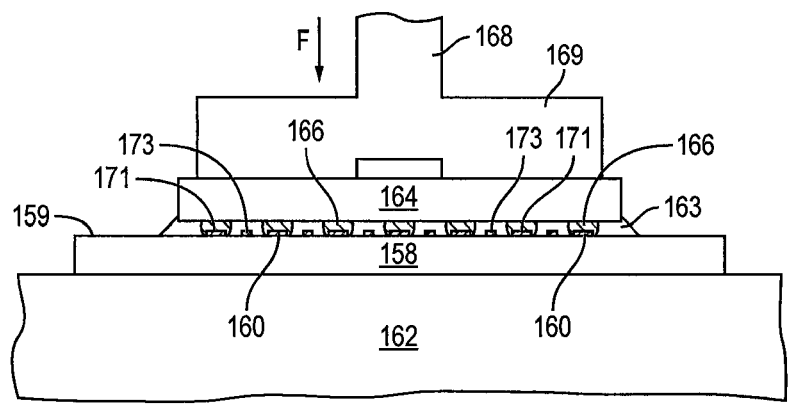
Figure 12C:
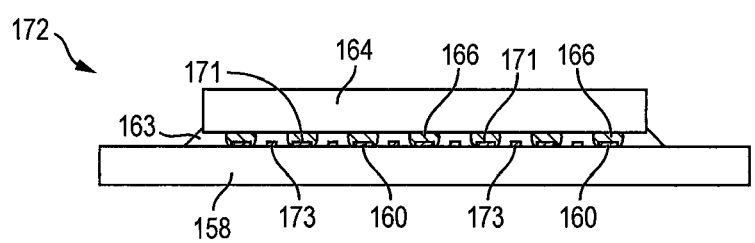

One embodiment of making a BONP interconnection is shown in FIGS. 12a-12c. In FIG. 12a, substrate 112 has at least one dielectric layer and having a metal layer on a die attach surface 159. The metal layer is patterned to provide circuitry, particularly narrow interconnection pads 160 on traces or leads, on the die attach surface. Substrate 158 is supported on a carrier or stage 162, with a substrate surface opposite die attach surface 159 facing the support. A quantity of an encapsulating resin 163 is dispensed over die attach surface 159 of substrate 158, covering the narrow interconnection pads 160 on the leads. Semiconductor 164 has bumps 166 attached to die pads on active side 167. Bumps 166 include a fusible material which contacts the mating surfaces of the narrow pads. A pick-and-place tool 168 including a chuck 169 picks up semiconductor die 164 by contact of the chuck with backside 170 of the die. Using pick-and-place tool 168, semiconductor die 164 is positioned facing substrate 158 with active side 167 of the die toward the die attach surface of substrate 158. Semiconductor die 164 and substrate 158 are aligned and moved one toward the other, as shown by arrow M, so that bumps 166 contact the corresponding narrow interconnection pads 160 on the traces or leads on the substrate. A force F is applied to press bumps 166 onto mating surfaces 171 at narrow pads 160 on the leads, as shown in FIG. 12b. The force F must be sufficient to displace adhesive 163 from between bumps 166 and mating surfaces 171 at the narrow interconnection pads 160. Bumps 166 can be deformed by the force F, breaking the oxide film on the contacting surface of the bumps and/or on mating surface 171 of narrow pads 160. The deformation of bumps 166 can result in the fusible material of the bumps being pressed onto the top and over the edges of the narrow pads 160. Adhesive 163 is cured partially by heating to a selected temperature. At this stage, adhesive 163 need only be partially cured, that is, only to an extent sufficient subsequently to prevent flow of molten solder along an interface between the adhesive and the conductive traces. The fusible material of bumps 166 is melted and re-solidified forming a metallurgical interconnection between bump 166 and narrow pad 160. Adhesive 163 is completely cured to finish the die mount and secure the electrical interconnection at mating surface 171, as shown generally at 172 in FIG. 12c. An electrical interconnect is thus formed between bumps 166 and corresponding narrow interconnection pads 160 on the leads, in a configuration as in FIG. 8. Other leads 173 are interconnected on narrow interconnection pads at other localities, which would be visible in other sectional views. The curing of adhesive 163 can be completed prior to, or concurrently with, or following melting the solder. Typically, adhesive 163 is a thermally curable adhesive, and the extent of curing at any phase in the process is controlled by regulating the temperature. The components can be heated and cured by raising the temperature of chuck 169 on pick and place tool 168, or by raising the temperature of the substrate support.

Figure 13A:
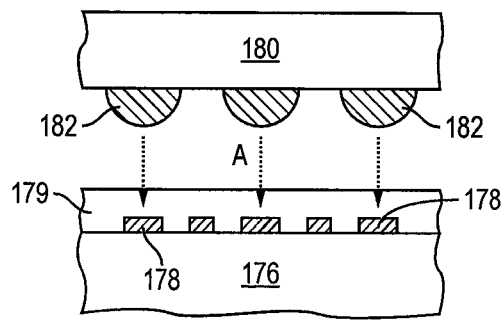
FIGS. 13a-13d illustrate further detail of the process for making a flipchip interconnection.
Figure 13B:
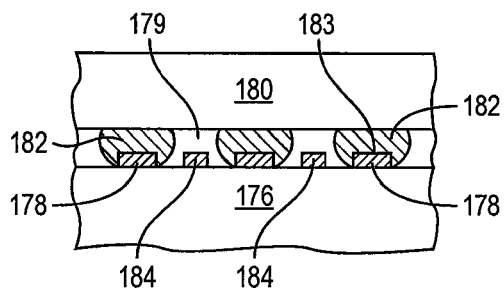
Figure 13C:
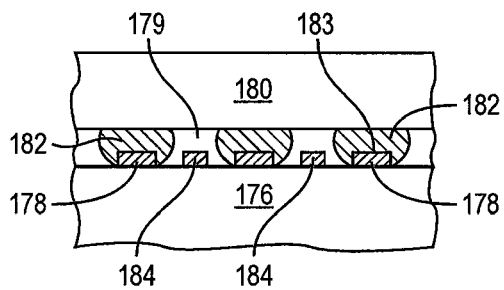
Figure 13D:
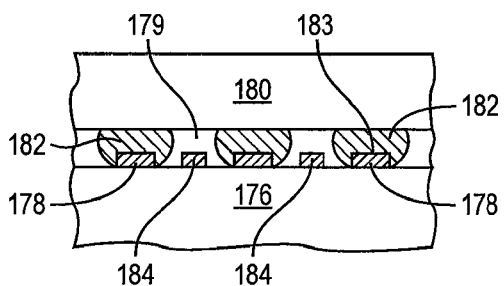

The process is shown in further detail in FIGS. 13a-13d. In FIG. 13a, substrate 176 is provided on a die attach surface with conductive traces and narrow interconnection pads 178 at interconnect sites on the traces covered with an adhesive 179. Semiconductor die 180 is positioned in relation to substrate 176 such that the active side of the die faces the die attach side of the substrate and aligned by arrows A so that bumps 182 on the die coincide with corresponding mating surfaces on narrow pads 178. Semiconductor die 180 and substrate 176 are moved toward one another so that bumps 182 contact the respective mating surfaces on narrow pads 178. In FIG. 13b, a force is applied to move bumps 182 and narrow pads 178 against one another, displacing adhesive 179 and deforming the bumps onto mating surfaces 183 and over the edges of the narrow pads. The deformation of bumps 182 on narrow pads 178 breaks the oxide film on the contact surfaces of the bumps and mating surfaces 183 of the narrow pads establishing a good electrical connection. The deformation of the bumps over the edges of the narrow pads helps establish a good temporary mechanical connection. The narrow interconnection pads of traces 184 are out of the plane of FIG. 13b. Heat is applied to partially cure adhesive 179, as shown in FIG. 13c. Additional heat is applied to raise the temperature of bumps 182 sufficiently to cause the fusible material of the bumps to melt and complete the cure of adhesive 179, as shown in FIG. 13d. A metallurgical interconnection is thus formed between bumps 182 and narrow interconnection pads 178 at mating surfaces 183. The cured adhesive 179 stabilizes the die mount.

In an alternative embodiment, the adhesive can be pre-applied to the die surface, or at least to the bumps on the die surface, rather than to the substrate. The adhesive can be pooled in a reservoir, and the active side of the die can be dipped in the pool and removed so that a quantity of the adhesive is carried on the bumps. Using a pick-and-place tool, the die is positioned facing a supported substrate with the active side of the die toward the die attach surface of the substrate. The die and substrate are aligned and moved one toward the other so that the bumps contact the corresponding traces or leads on the substrate. Such a method is described in U.S. Pat. No. 6,780,682, which is hereby incorporated by reference. The forcing, curing, and melting steps are carried out as described above.

Alternatively, the flipchip interconnection is formed by providing a substrate having narrow interconnection pads formed in a die attach surface, providing a solder mask having openings over the narrow pads and a semiconductor die having bumps attached to interconnect pads in an active surface, supporting the substrate and the die, positioning the die with the active side of the die toward the die attach surface of the substrate, aligning the die and substrate and moving one toward the other so that the bumps contact the corresponding narrow pads on the substrate, and melting and then re-solidifying to form the interconnection between the bump and the narrow pad.

In another embodiment, the flipchip interconnection is formed by providing a substrate having narrow interconnection pads formed in a die attach surface, providing a solder mask having openings over the narrow pads, depositing solder paste on the narrow pads, attaching a semiconductor die having bumps to interconnect pads in an active surface, supporting the substrate and the die, positioning the die with the active side of the die toward the die attach surface of the substrate, aligning the die and substrate and moving one toward the other so that the bumps contact the solder paste on the corresponding narrow pads on the substrate, and melting and then re-solidifying the solder paste to form a metallurgical interconnection between the bump and the narrow pad.

Figure 14:
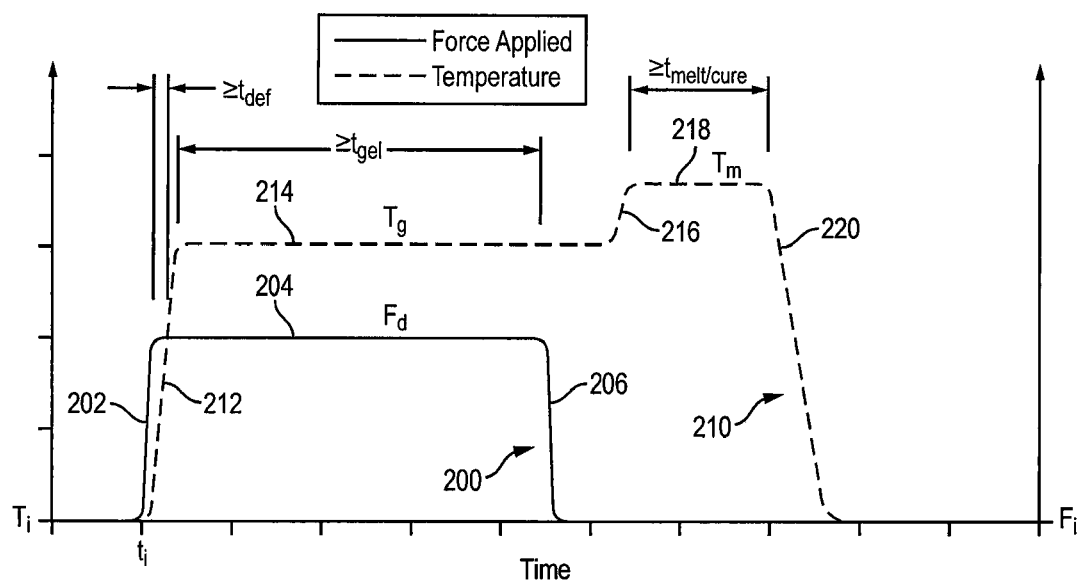
FIG. 14 illustrates a force and temperature schedule for a process for making a flipchip interconnection.

A force and temperature schedule for the above processes is shown in FIG. 14. Time runs from left to right on the horizontal axis. A force profile 200 is shown as a thick solid line, and a temperature profile 210 is shown as a dotted line. The temperature profile begins at a temperature in the range about 80° C. to 90° C. The force profile begins at essentially zero force. Beginning at an initial time $t_i$, the force is rapidly raised 202 from $F_i$ to a displacement/deformation force $F_d$ and held 204 at that force for a time, as discussed below. The force $F_d$ is sufficient to displace the adhesive away from between the bumps and mating surfaces of the narrow interconnection pads. The force $F_d$ is sufficient to deform the fusible portion of the bumps onto the mating surface, breaking the oxide films and forming a good metal-to-metal metallurgical contact. In some embodiments, the bumps flow over the edges of the narrow pads to establish a mechanical interlock of the bumps and the narrow pads, referred to as creep deformation. The total amount of force required depends upon the bump material and dimensions and upon the number of bumps, and can be determined without undue experimentation.

As the force is raised, the temperature is also rapidly raised 212 from an initial temperature $T_i$ to a gel temperature $T_g$. The gel temperature $T_g$ is a temperature sufficient to partially cure the adhesive to a gel state. The force and temperature ramps are set so that there is a short lag time $t_{def}$, following the moment when $F_d$ is reached and before $T_g$ is reached, at least long enough to permit the elevated force to displace the adhesive and deform the bumps before the partial cure of the adhesive commences. The assembly is held 204 and 214 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase, that is, sufficiently firm to prevent undesirable displacement of the molten fusible material of the bump, or flow of the molten fusible material along the narrow pads and leads.

Once the adhesive has partially cured to a sufficient extent, the pressure can be ramped down rapidly 206 to substantially no force, i.e., only the weight of the components. The temperature is then rapidly raised further 216 to a temperature $T_m$ sufficient to remelt the fusible portions of the bumps. The assembly is held 218 at the remelt temperature $T_m$ for a time $t_{melt/cure}$ at least sufficient to fully form the solder remelt on the narrow pads, and sufficient to substantially though not necessarily fully cure the adhesive. The temperature is ramped down 220 to the initial temperature $T_i$, and eventually to ambient. The process outlined in FIG. 14 can run its course over a time period of 5-10 seconds.

The adhesive in FIG. 14 can be a no-flow underfill material. In some approaches to flipchip interconnection, the metallurgical interconnection is formed first, and then an underfill material is flowed into the space between the die and substrate. The no-flow underfill material is applied before the semiconductor die and substrate are brought together, and the no-flow underfill material is displaced by the approach of the bumps onto the narrow pads, and by the opposed surfaces of the die and substrate. The adhesive for the no-flow underfill material is a fast-gelling adhesive, that is, a material that gels sufficiently at the gel temperature in a time period in the order of 1-2 seconds. Typical materials for the no-flow underfill adhesive include non-conductive pastes.

Alternative bump structures can be employed in the BONP interconnects, such as composite bumps. Composite bumps have at least two bump portions, made of different bump materials, including one which is collapsible under reflow conditions, and one which is substantially non-collapsible under reflow conditions. The non-collapsible portion is attached to the interconnect site on the die. Typical materials for the non-collapsible portion include various solders having a high Pd content or Au. The collapsible portion is joined to the non-collapsible portion, and the collapsible portion makes the connection with the narrow interconnect pad. Typical materials for the collapsible portion of the composite bump include eutectic solders.

Figure 15:
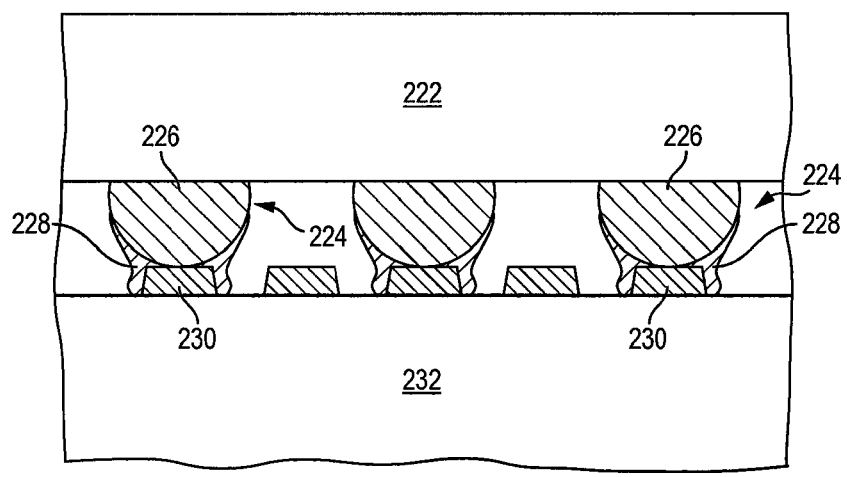
FIG. 15 illustrates a bump-on-narrow-pad flipchip interconnection.

FIG. 15 shows a BONP interconnect employing a composite bump. Semiconductor die 222 is provided with die pads on the active side of the die with composite bumps 224 that include a non-collapsible portion 226 and collapsible portion 228. The collapsible portion 228 can be eutectic solder or a relatively low temperature melt solder. The collapsible portion 228 contacts the mating surface of narrow pad 230 formed on substrate 232 and, where deformation of the fusible portion of the bump over the narrow pad is desired, the collapsible portion of the bump is deformable under the conditions of force employed. The non-collapsible portion 226 does not deform when the die is moved under pressure against the substrate during processing, and does not melt during the reflow phase of the process. Accordingly the non-collapsible portion 226 can be dimensioned to provide a standoff distance between the active surface of semiconductor die 222 and the die attach surface of substrate 232.

An interconnect in FIG. 15 can also be formed by bringing a non-composite non-collapsible bump with high-Pb or Au into contact with a narrow interconnect pad provided on the mating surface with a fusible material, such as, a eutectic solder or a relatively low temperature melt solder or solder paste. Alternatively, the narrow interconnect pad can be provided on the mating surface with a fusible material and the bumps can be composite bumps, also provided with a collapsible or fusible portion. Where the narrow interconnect pads are provided on the mating surface with a fusible material, a solder mask can be employed, followed by a capillary underfill, in the process.

The bumps in embodiments as shown in FIGS. 6-11 can be composite bumps, as described in FIG. 15, or using non-collapsible bumps with high-Pb or Au in a solder-on-narrow-pad method, as described above.

As the techniques for forming the traces improve, it is possible to reliably form traces having nominal or design rule widths less than about 25 µm. The reduced trace widths can provide for increased routing density. A reliable mechanical connection and good electrical interconnection can be made by forming a narrow interconnect pad by widening the lead to an extent dimensionally related to the bump base diameter, and limited to less than the bump base diameter.

The narrow interconnect pad can be formed with a variety of shapes. Some such shapes can be more readily manufacturable, and some may provide other process advantages. The narrow pad can be generally rectangular, either square or elongated, as shown with narrow pad 240 on the end of trace 242 in FIG. 16a and narrow pad 244 on the end of trace 246 in FIG. 16b, or generally round, either circular or elliptical, as shown with narrow pad 248 on the end of trace 250 in FIG. 16c and narrow pad 252 on the end of trace 254 in FIG. 16d. Other shapes can be used such as shown in FIG. 16e with semicircular end portions 256 separated lengthwise by a square or rectangular portion 257 on the end of trace 258. The narrow pad can be formed as a symmetrical or asymmetrical widening in the lead or trace shown as a generally rectangular pad 260 on the end of trace 262 in FIG. 17a and narrow pad 264 on the end of trace 266 in FIG. 17b. Also, the narrow pad need not be situated at, or near, the end of the lead or trace, but can be formed at any point where interconnection is specified, as shown in FIG. 17c with generally rectangular pad 268 formed along trace 270. Forming the pad longer than wide increases the wettable mating surface of the narrow pad by nature of the planar surface plus the exposed parts of the sides, and can improve the mechanical strength of the interconnection. Where the pad is longer than wide, the tolerance for misalignment of solder mask openings or bump is increased, particularly where the pad is at the end of the trace, an elongated pad can reduce the likelihood that a solder mask opening or bump will be situated off the end of the pad.

FIGS. 18a-18b show an embodiment with a generally rectangular solder mask opening, either square or elongated. A square or rectangle of a given width has a greater area than a circle or ellipse having the same width or diameter along short axis. In FIG. 18a, square mask opening 272 has a capacity to hold a greater quantity of solder paste or other fusible material, and can provide an advantage where a fusible material such as a solder paste is to be applied to the mating surfaces on narrow pads 273, as formed on trace 274, prior to mating with the bumps. FIG. 18b shows a rectangular mask opening 275 over narrow pad 276 formed on trace 278 with similar capacity to hold a greater quantity of solder paste or other fusible material. Also, it can be easier to print a fusible material into a square or rectangular mask opening than into a circular or elliptical mask opening, because there is greater tolerance for misalignment in the printing process. Given a width limitation for the mask opening, a square or rectangular mask opening provides a greater open area for mounting a large bump on pad 273 or 276 during the interconnection process.

Figure 19:
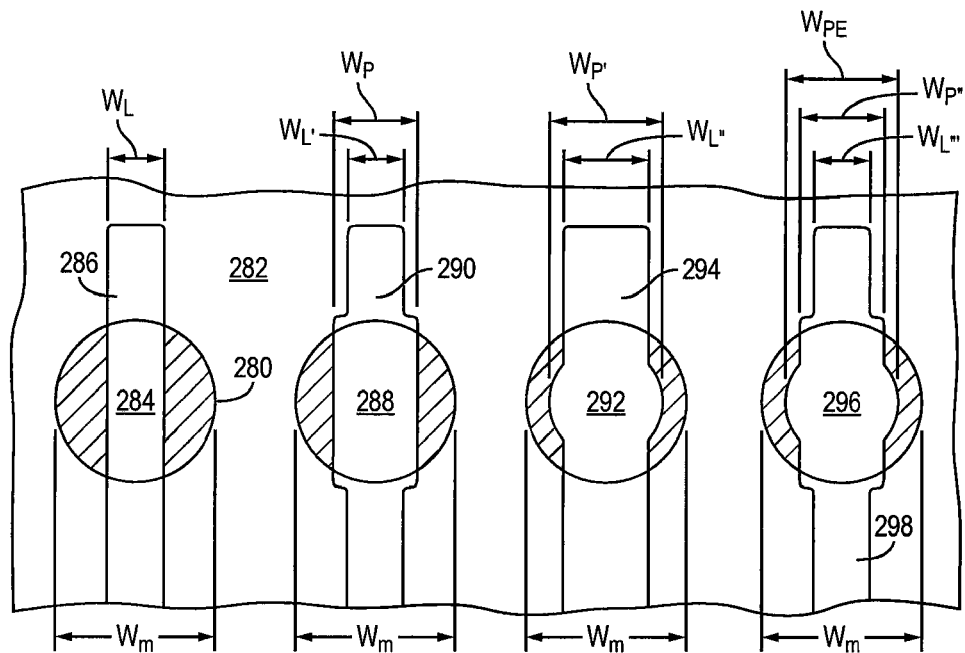
FIG. 19 illustrates various interconnect pad configurations in relation to a solder mask opening.

Various narrow pad configurations are shown in FIG. 19 in relation to a circular mask opening 280 in solder mask 282. The mask opening in each example has a width or diameter $W_m$ of about 90 µm. A BOL configuration is shown at 284 with lead or trace 286 having a nominal design width $W_L$ of about 30 µm. A narrow pad having a rectangular shape is shown at 288 with lead or trace 290 having a nominal design width $W_L'$ of about 30 µm. The rectangular narrow pad 288 has a width $W_P$ of about 45 µm. A narrow pad having an oval shape is shown at 292 formed at a wider lead or trace 294, having a nominal design width $W_L''$ of about 50 µm. The oval portion of narrow pad 292 has a width $W_P'$ of about 55 µm. A narrow pad having a rectangular shape expanded with an oval shape is shown at 296. The narrower lead or trace 298 at which narrow pad 296 is formed has a nominal design width $W_L'''$ of about 30 µm. The rectangular portion of narrow pad 296 has a width $W_P''$ of about 45 µm, and the oval expanded portion has a width WPE of about 50 µm.

Figure 20:
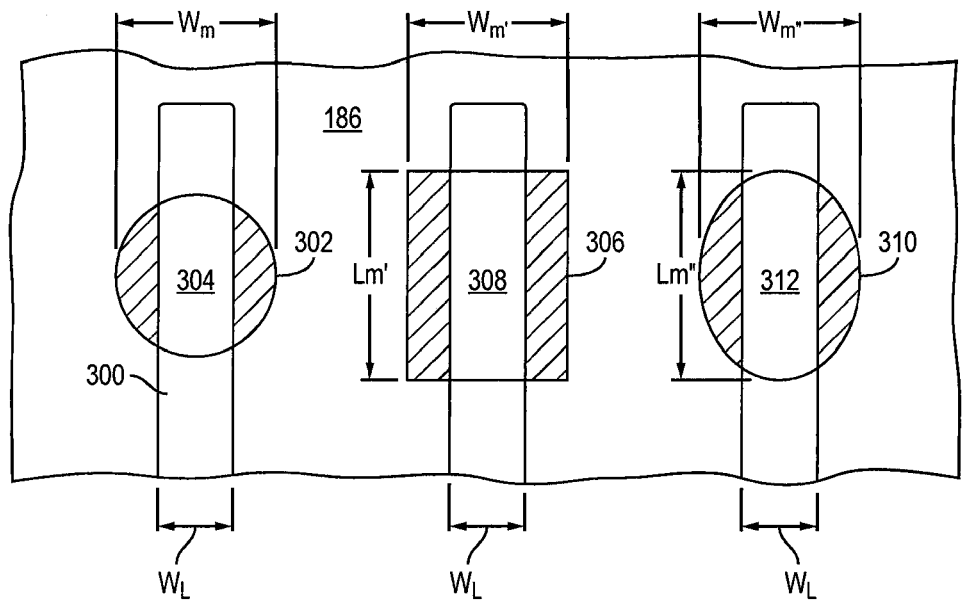
FIG. 20 illustrates various solder mask configurations in relation to an interconnect pad.

Various solder mask opening configurations are shown in FIG. 20 in relation to a lead or trace 300 or narrow pad 304. In these examples the lead or narrow pad at the interconnect site has a width $W_L$ of about 40 µm. In a first example, a circular solder mask opening 302 having a width or diameter $W_m$ of about 90 µm, exposes an interconnect site portion 304. In a second example, a rectangular solder mask opening 306 having a width across the lead or narrow pad $W_m'$ of about 80 µm, and a length $L_m'$ of about 120 µm, exposes an interconnect site portion 308. In a third example, an elliptical solder mask opening 310 having a width across the lead or narrow pad $W_M''$ of about 80 µm, and a length $L_M''$ of about 120 µm exposes an interconnect site portion 312. Both the rectangular opening 306 and oval opening 310 expose a greater length or area of the lead or pad 312 than does the circular solder mask opening 302, even though the circular opening has a greater diameter, which provides a greater area for solder reflow during the interconnect process, and can result in a more robust interconnection. The area exposed by the rectangular opening 306 is slightly greater than that provided by the elliptical opening 310 having the same width and length. Moreover, the area would be reduced if there were a slight misalignment of the elliptical opening, but not by a slight misalignment of the rectangular opening. As a practical matter, however, a design rectangular opening can have more or less rounded corners because of resolution limitations in processes for patterning openings in the solder mask dielectric.

The diameter of the bump base on the die can be about 90 µm, and the narrow interconnect pad is formed on the substrate to a width in a range about 25 µm, where the trace width is less than about 25 µm, to about 50 µm. The narrow interconnect pad provides a significant improvement in routing density, as compared with a substrate having a conventional capture pad having a much larger diameter, typically two to four times as great as the trace width.

The BOL, BONL, and BONP interconnection structures shown in FIGS. 6-20 can be produced by any of several methods, with or without a solder mask. In general, interconnect bumps are affixed onto interconnect pads on the active side of the die. An upper die attach surface of the substrate has an upper metal layer patterned to provide the traces and narrow pads at interconnect sites as appropriate for interconnection with the arrangement of bumps on the particular die. An encapsulating resin adhesive is employed to confine the solder flow during a melt phase of the interconnection process. The BOL, BONL, and BONP interconnects can provide a significantly higher signal trace escape routing density. The conductive traces have a pitch as determined by minimum spacing between adjacent conductive traces that can be placed on the substrate and the width of the interconnect site provides a routing density equal to the pitch of the conductive traces.

FIGS. 21-26 describe other embodiments with various interconnect structures which can be used with the BOL, BONL, or BONP interconnect, as described in FIGS. 6-20. FIG. 21a shows a semiconductor wafer 320 with a base substrate material 322, such as silicon, germanium, gallium arsenide, indium phosphide, or silicon carbide, for structural support. A plurality of semiconductor die or components 324 is formed on wafer 320 separated by saw streets 326 as described above.

Figure 21A:
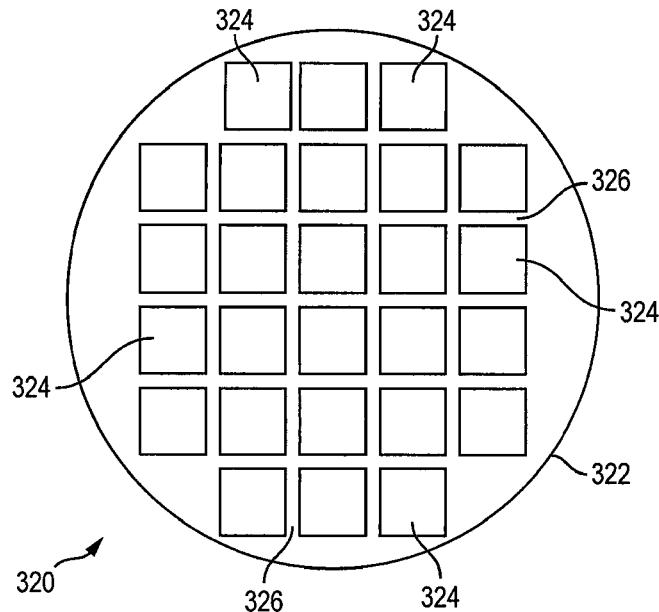
FIGS. 21a-21h illustrate various interconnect structures formed over a semiconductor die for bonding to conductive traces on a substrate.
Figure 21B:
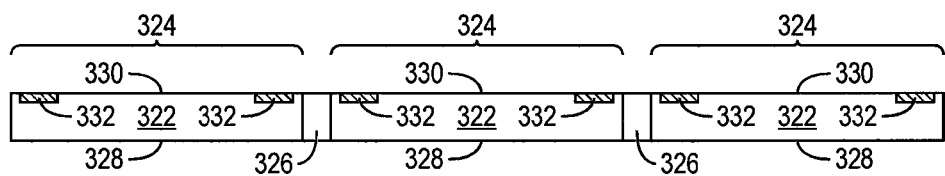

FIG. 21b shows a cross-sectional view of a portion of semiconductor wafer 320. Each semiconductor die 324 has a back surface 328 and active surface 330 containing analog or digital circuits implemented as active devices, passive devices, conductive layers, and dielectric layers formed within the die and electrically interconnected according to the electrical design and function of the die. The circuit can include one or more transistors, diodes, and other circuit elements formed within active surface 330 to implement analog circuits or digital circuits, such as digital signal processor (DSP), ASIC, memory, or other signal processing circuit. Semiconductor die 324 may also contain integrated passive devices (IPDs), such as inductors, capacitors, and resistors, for RF signal processing. In one embodiment, semiconductor die 324 is a flipchip type semiconductor die.

An electrically conductive layer 332 is formed over active surface 330 using PVD, CVD, electrolytic plating, electroless plating process, or other suitable metal deposition process. Conductive layer 332 can be one or more layers of Al, Cu, Sn, Ni, Au, Ag, or other suitable electrically conductive material. Conductive layer 332 operates as contact pads electrically connected to the circuits on active surface 330.

Figure 21C:
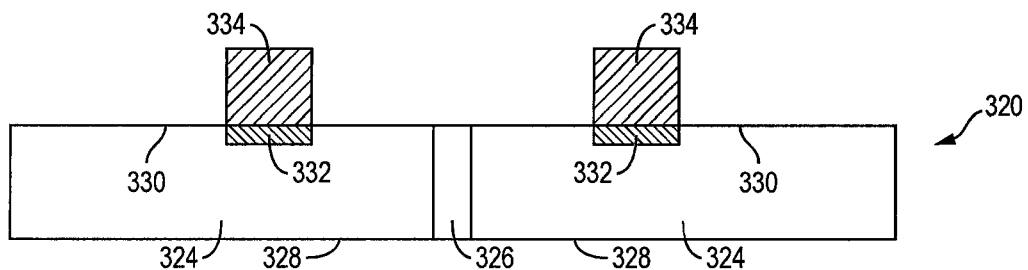
Figure 21D:
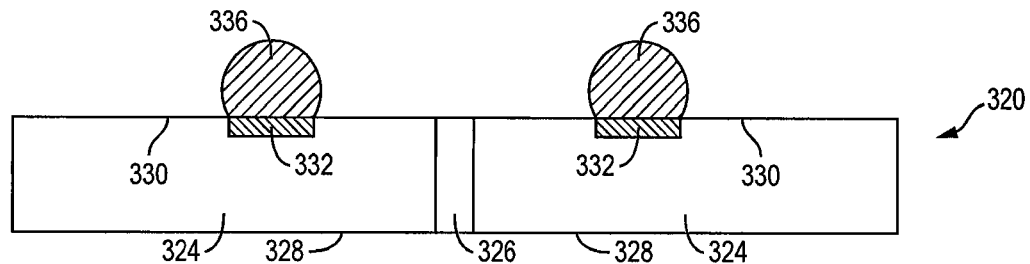

FIG. 21c shows a portion of semiconductor wafer 320 with an interconnect structure formed over contact pads 332. An electrically conductive bump material 334 is deposited over contact pads 332 using an evaporation, electrolytic plating, electroless plating, ball drop, or screen printing process. Bump material 334 can be Al, Sn, Ni, Au, Ag, Pb, Bi, Cu, solder, and combinations thereof, with an optional flux solution. Bump material 334 can be eutectic Sn/Pb, high-lead solder, or lead-free solder. Bump material 334 is generally compliant and undergoes plastic deformation greater than about 25 μm under a force equivalent to a vertical load of about 200 grams. Bump material 334 is bonded to contact pad 332 using a suitable attachment or bonding process. Bump material 334 can be compression bonded to contact pad 332. Bump material 334 can also be reflowed by heating the material above its melting point to form spherical balls or bumps 336, as shown in FIG. 21d. In some applications, bumps 336 are reflowed a second time to improve electrical connection to contact pad 332. Bumps 336 represent one type of interconnect structure that can be formed over contact pad 332. The interconnect structure can also use stud bump, micro bump, or other electrical interconnect.

Figure 21E:
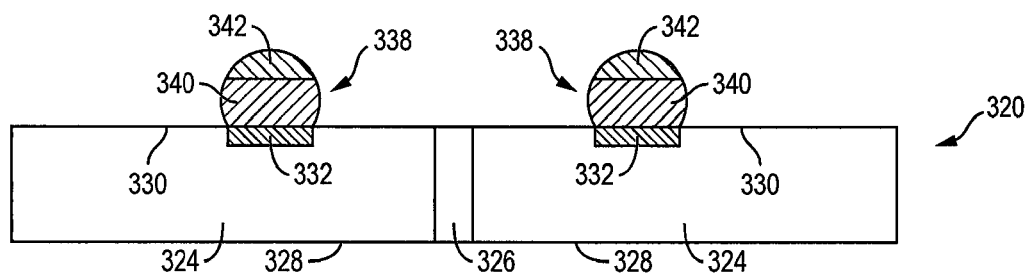

FIG. 21e shows another embodiment of the interconnect structure formed over contact pads 332 as composite bumps 338 including a non-fusible or non-collapsible portion 340 and fusible or collapsible portion 342. The fusible or collapsible and non-fusible or non-collapsible attributes are defined for bumps 338 with respect to reflow conditions. The non-fusible portion 340 can be Au, Cu, Ni, high-lead solder, or lead-tin alloy. The fusible portion 342 can be Sn, lead-free alloy, Sn—Ag alloy, Sn—Ag—Cu alloy, Sn—Ag-indium (In) alloy, eutectic solder, tin alloys with Ag, Cu, or Pb, or other relatively low temperature melt solder. In one embodiment, given a contact pad 332 width or diameter of 100 μm, the non-fusible portion 340 is about 45 μm in height and fusible portion 342 is about 35 μm in height.

Figure 21F:
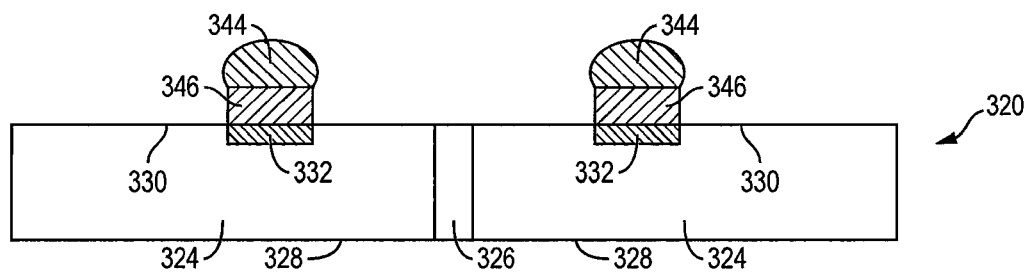

FIG. 21f shows another embodiment of the interconnect structure formed over contact pads 332 as bump 344 over conductive pillar 346. Bump 344 is fusible or collapsible and conductive pillar 346 is non-fusible or non-collapsible. The fusible or collapsible and non-fusible or non-collapsible attributes are defined with respect to reflow conditions. Bump 344 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. Conductive pillar 346 can be Au, Cu, Ni, high-lead solder, or lead-tin alloy. In one embodiment, conductive pillar 346 is a Cu pillar and bump 344 is a solder cap. Given a contact pad 332 width or diameter of 100 μm, conductive pillar 346 is about 45 μm in height and bump 344 is about 35 μm in height.

Figure 21G:
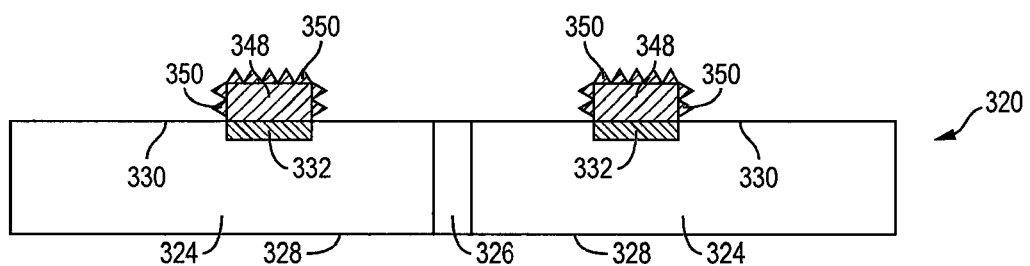

FIG. 21g shows another embodiment of the interconnect structure formed over contact pads 332 as bump material 348 with asperities 350. Bump material 348 is soft and deformable under reflow conditions with a low yield strength and high elongation to failure, similar to bump material 334. Asperities 350 are formed with a plated surface finish and are shown exaggerated in the figures for purposes of illustration. The scale of asperities 350 is generally in the order about 1-25 μm. The asperities can also be formed on bump 336, composite bump 338, and bump 344.

Figure 21H:
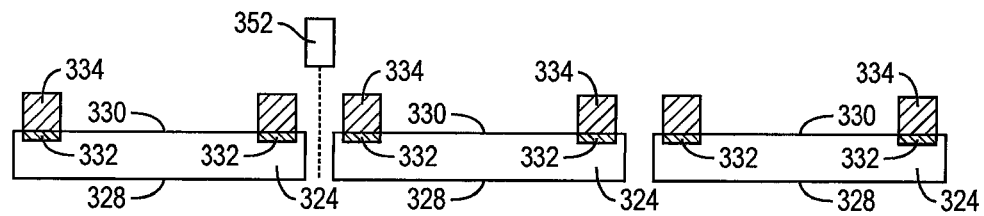

In FIG. 21h, semiconductor wafer 320 is singulated through saw street 326 using a saw blade or laser cutting tool 352 into individual semiconductor die 324.

Figure 22A:
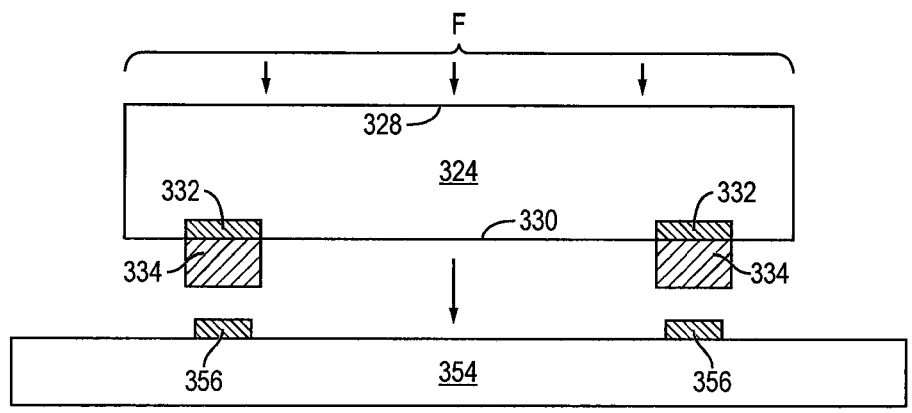
FIGS. 22a-22g illustrate the semiconductor die and interconnect structure bonded to the conductive traces.

FIG. 22a shows a substrate or PCB 354 with conductive trace 356. Substrate 354 can be a single-sided FR5 laminate or 2-sided BT-resin laminate. Semiconductor die 324 is positioned so that bump material 334 is aligned with an interconnect site on conductive trace 356, see FIGS. 30a-30g. Alternatively, bump material 334 can be aligned with a conductive pad or other interconnect site formed on substrate 354. Bump material 334 is wider than conductive trace 356. In one embodiment, bump material 334 has a width of less than 100 μm and conductive trace or pad 356 has a width of 35 μm for a bump pitch of 150 μm. Conductive trace 356 could be part of the BOL, BONL, or BONP interconnect of FIGS. 6-20.

Figure 22B:
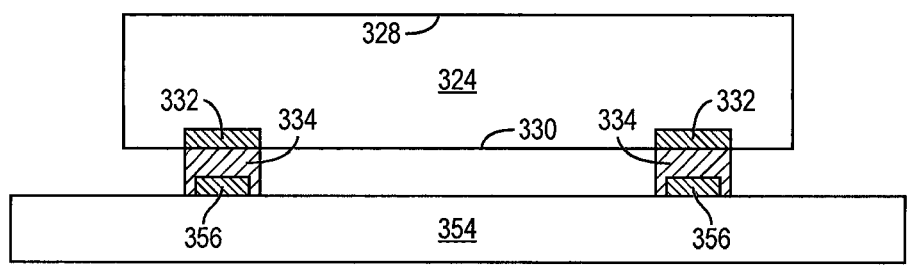

A pressure or force F is applied to back surface 328 of semiconductor die 324 to press bump material 334 onto conductive trace 356. The force F can be applied with an elevated temperature. Due to the compliant nature of bump material 334, the bump material deforms or extrudes around the top surface and side surfaces of conductive trace 356, referred to as BOL. In particular, the application of pressure causes bump material 334 to undergo a plastic deformation greater than about 25 μm under force F equivalent to a vertical load of about 200 grams and cover the top surface and side surfaces of the conductive trace, as shown in FIG. 22b. Bump material 334 can also be metallurgically connected to conductive trace 356 by bringing the bump material in physical contact with the conductive trace and then reflowing the bump material under a reflow temperature.

By making conductive trace 356 narrower than bump material 334, the conductive trace pitch can be reduced to increase routing density and I/O count. The narrower conductive trace 356 reduces the force F needed to deform bump material 334 around the conductive trace. For example, the requisite force F may be 30-50% of the force needed to deform bump material against a conductive trace or pad that is wider than the bump material. The lower compressive force F is useful for fine pitch interconnect and small die to maintain coplanarity with a specified tolerance and achieve uniform z-direction deformation and high reliability interconnect union. In addition, deforming bump material 334 around conductive trace 356 mechanically locks the bump to the trace to prevent die shifting or die floating during reflow.

Figure 22C:
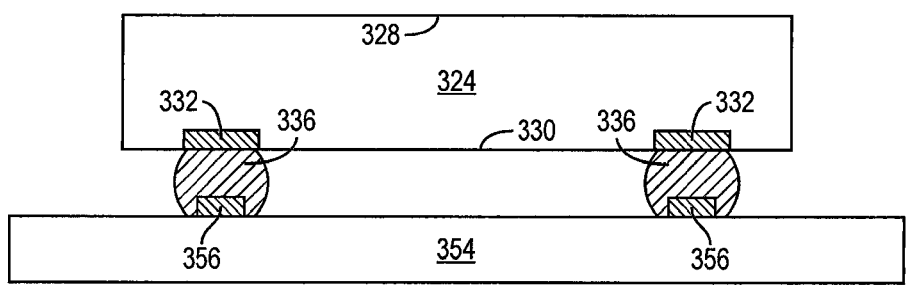

FIG. 22c shows bump 336 formed over contact pad 332 of semiconductor die 324. Semiconductor die 324 is positioned so that bump 336 is aligned with an interconnect site on conductive trace 356. Alternatively, bump 336 can be aligned with a conductive pad or other interconnect site formed on substrate 354. Bump 336 is wider than conductive trace 356. Conductive trace 356 could be part of the BOL, BONL, or BONP interconnect of FIGS. 6-20.

A pressure or force F is applied to back surface 328 of semiconductor die 324 to press bump 336 onto conductive trace 356. The force F can be applied with an elevated temperature. Due to the compliant nature of bump 336, the bump deforms or extrudes around the top surface and side surfaces of conductive trace 356. In particular, the application of pressure causes bump material 336 to undergo a plastic deformation and cover the top surface and side surfaces of conductive trace 356. Bump 336 can also be metallurgically connected to conductive trace 356 by bringing the bump in physical contact with the conductive trace under reflow temperature.

By making conductive trace 356 narrower than bump 336, the conductive trace pitch can be reduced to increase routing density and I/O count. The narrower conductive trace 356 reduces the force F needed to deform bump 336 around the conductive trace. For example, the requisite force F may be 30-500 of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming bump 336 around conductive trace 356 mechanically locks the bump to the trace to prevent die shifting or die floating during reflow.

Figure 22D:
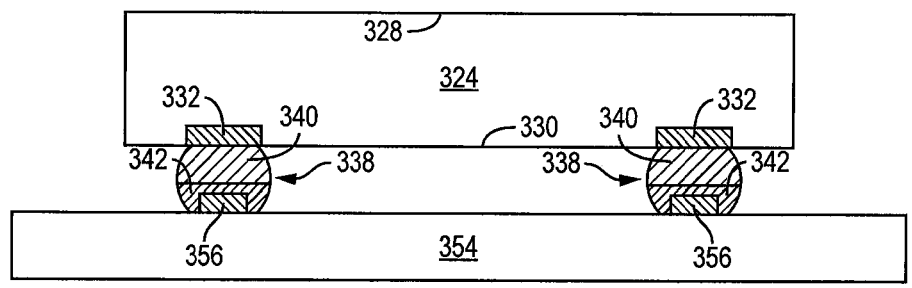

FIG. 22d shows composite bump 338 formed over contact pad 332 of semiconductor die 324. Semiconductor die 324 is positioned so that composite bump 338 is aligned with an interconnect site on conductive trace 356. Alternatively, composite bump 338 can be aligned with a conductive pad or other interconnect site formed on substrate 354. Composite bump 338 is wider than conductive trace 356. Conductive trace 356 could be part of the BOL, BONL, or BONP interconnect of FIGS. 6-20.

A pressure or force F is applied to back surface 328 of semiconductor die 324 to press fusible portion 342 onto conductive trace 356. The force F can be applied with an elevated temperature. Due to the compliant nature of fusible portion 342, the fusible portion deforms or extrudes around the top surface and side surfaces of conductive trace 356. In particular, the application of pressure causes fusible portion 342 to undergo a plastic deformation and cover the top surface and side surfaces of conductive trace 356. Composite bump 338 can also be metallurgically connected to conductive trace 356 by bringing fusible portion 342 in physical contact with the conductive trace under reflow temperature. The non-fusible portion 340 does not melt or deform during the application of pressure or temperature and retains its height and shape as a vertical standoff between semiconductor die 324 and substrate 354. The additional displacement between semiconductor die 324 and substrate 354 provides greater coplanarity tolerance between the mating surfaces.

During a reflow process, a large number (e.g., thousands) of composite bumps 338 on semiconductor die 324 are attached to interconnect sites on conductive trace 356 of substrate 354. Some of the bumps 338 may fail to properly connect to conductive trace 356, particularly if die 324 is warped. Recall that composite bump 338 is wider than conductive trace 356. With a proper force applied, the fusible portion 342 deforms or extrudes around the top surface and side surfaces of conductive trace 356 and mechanically locks composite bump 338 to the conductive trace. The mechanical interlock is formed by nature of the fusible portion 342 being softer and more compliant than conductive trace 356 and therefore deforming over the top surface and around the side surfaces of the conductive trace for greater contact surface area. The mechanical interlock between composite bump 338 and conductive trace 356 holds the bump to the conductive trace during reflow, i.e., the bump and conductive trace do not lose contact. Accordingly, composite bump 338 mating to conductive trace 356 reduces bump interconnect failures.

Figure 22E:
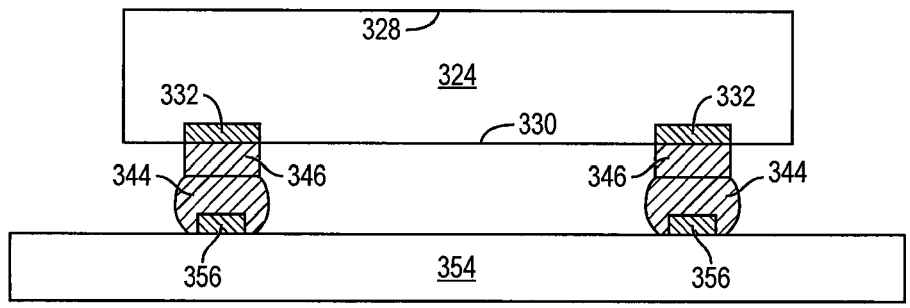

FIG. 22e shows conductive pillar 346 and bump 344 formed over contact pad 332 of semiconductor die 324. Semiconductor die 324 is positioned so that bump 344 is aligned with an interconnect site on conductive trace 356. Alternatively, bump 344 can be aligned with a conductive pad or other interconnect site formed on substrate 354. Bump 344 is wider than conductive trace 356. Conductive trace 356 could be part of the BOL, BONL, or BONP interconnect of FIGS. 6-20.

A pressure or force F is applied to back surface 328 of semiconductor die 324 to press bump 344 onto conductive trace 356. The force F can be applied with an elevated temperature. Due to the compliant nature of bump 344, the bump deforms or extrudes around the top surface and side surfaces of conductive trace 356. In particular, the application of pressure causes bump 344 to undergo a plastic deformation and cover the top surface and side surfaces of conductive trace 356. Conductive pillar 346 and bump 344 can also be metallurgically connected to conductive trace 356 by bringing the bump in physical contact with the conductive trace under reflow temperature. Conductive pillar 346 does not melt or deform during the application of pressure or temperature and retains its height and shape as a vertical standoff between semiconductor die 324 and substrate 354. The additional displacement between semiconductor die 324 and substrate 354 provides greater coplanarity tolerance between the mating surfaces. The wider bump 344 and narrower conductive trace 356 have similar low requisite compressive force and mechanical locking features and advantages described above for bump material 334 and bump 336.

Figure 22F:
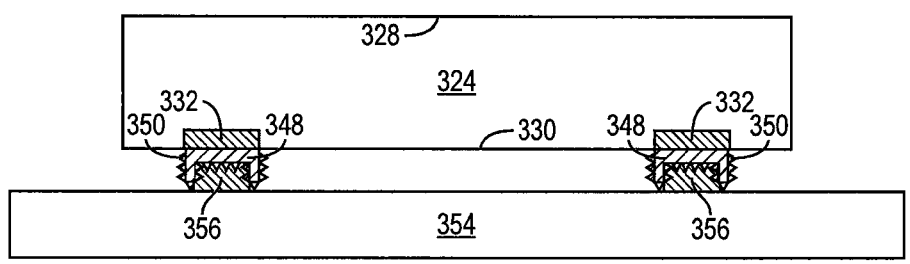

FIG. 22f shows bump material 348 with asperities 350 formed over contact pad 332 of semiconductor die 324. Semiconductor die 324 is positioned so that bump material 348 is aligned with an interconnect site on conductive trace 356. Alternatively, bump material 348 can be aligned with a conductive pad or other interconnect site formed on substrate 354. Bump material 348 is wider than conductive trace 356. A pressure or force F is applied to back surface 328 of semiconductor die 324 to press bump material 348 onto conductive trace 356. The force F can be applied with an elevated temperature. Due to the compliant nature of bump material 348, the bump deforms or extrudes around the top surface and side surfaces of conductive trace 356. In particular, the application of pressure causes bump material 348 to undergo a plastic deformation and cover the top surface and side surfaces of conductive trace 356. In addition, asperities 350 are metallurgically connected to conductive trace 356. Asperities 350 are sized on the order about 1-25 μm.

Figure 22G:
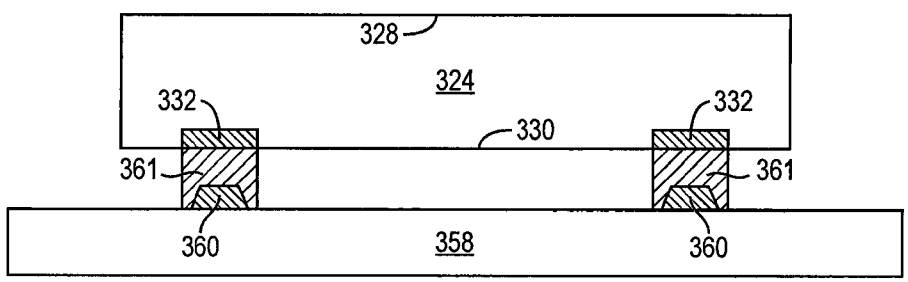

FIG. 22g shows a substrate or PCB 358 with trapezoidal conductive trace 360 having angled or sloped sides. Bump material 361 is formed over contact pad 332 of semiconductor die 324. Semiconductor die 324 is positioned so that bump material 361 is aligned with an interconnect site on conductive trace 360. Alternatively, bump material 361 can be aligned with a conductive pad or other interconnect site formed on substrate 358. Bump material 361 is wider than conductive trace 360. Conductive trace 360 could be part of the BOL, BONL, or BONP interconnect of FIGS. 6-20.

A pressure or force F is applied to back surface 328 of semiconductor die 324 to press bump material 361 onto conductive trace 360. The force F can be applied with an elevated temperature. Due to the compliant nature of bump material 361, the bump material deforms or extrudes around the top surface and side surfaces of conductive trace 360. In particular, the application of pressure causes bump material 361 to undergo a plastic deformation under force F to cover the top surface and the angled side surfaces of conductive trace 360. Bump material 361 can also be metallurgically connected to conductive trace 360 by bringing the bump material in physical contact with the conductive trace and then reflowing the bump material under a reflow temperature.

FIGS. 23a-23d show a BOL embodiment of semiconductor die 324 and elongated composite bump 362 having a non-fusible or non-collapsible portion 364 and fusible or collapsible portion 366. The non-fusible portion 364 can be Au, Cu, Ni, high-lead solder, or lead-tin alloy. The fusible portion 366 can be Sn, lead-free alloy, Sn—Ag alloy, Sn—Ag—Cu alloy, Sn—Ag—In alloy, eutectic solder, tin alloys with Ag, Cu, or Pb, or other relatively low temperature melt solder. The non-fusible portion 364 makes up a larger part of composite bump 362 than the fusible portion 366. The non-fusible portion 364 is fixed to contact pad 332 of semiconductor die 324.

Figure 23A:
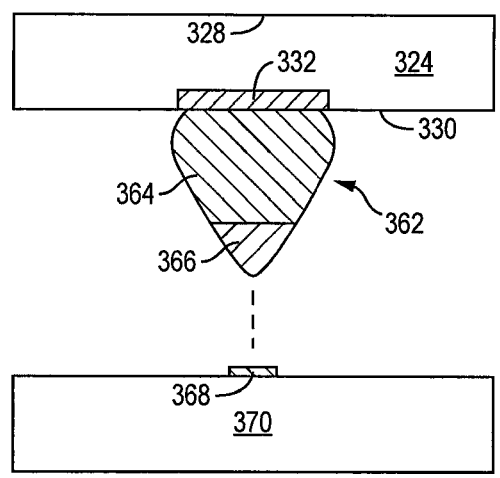
FIGS. 23a-23d illustrate the semiconductor die with a wedge-shaped interconnect structure bonded to the conductive traces.
Figure 23B:
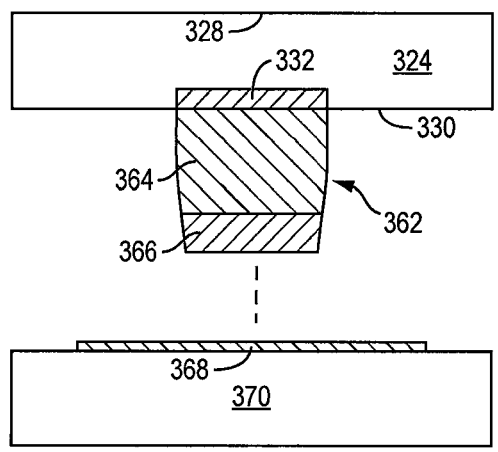
Figure 23C:
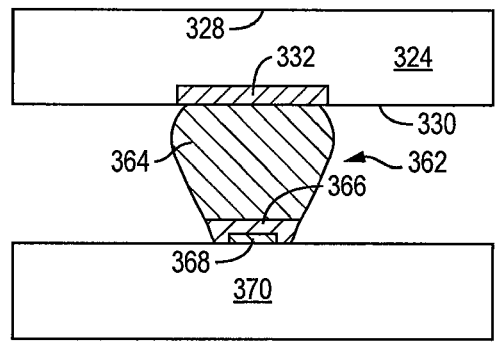
Figure 23D:
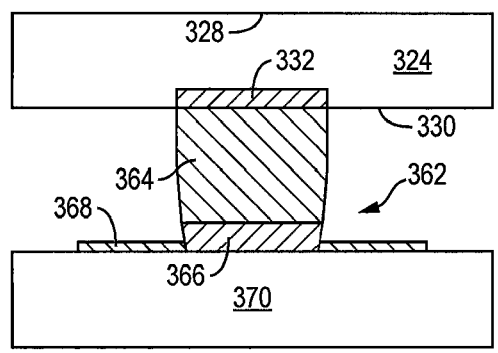

Semiconductor die 324 is positioned so that composite bump 362 is aligned with an interconnect site on conductive trace 368 formed on substrate 370, as shown in FIG. 23a. Composite bump 362 is tapered along conductive trace 368, i.e., the composite bump has a wedge shape, longer along a length of conductive trace 368 and narrower across the conductive trace. The tapered aspect of composite bump 362 occurs along the length of conductive trace 368. The view in FIG. 23a shows the shorter aspect or narrowing taper co-linear with conductive trace 368. The view in FIG. 23b, normal to FIG. 23a, shows the longer aspect of the wedge-shaped composite bump 362. The shorter aspect of composite bump 362 is wider than conductive trace 368. The fusible portion 366 collapses around conductive trace 368 upon application of pressure and/or reflow with heat, as shown in FIGS. 23c and 23d. The non-fusible portion 364 does not melt or deform during reflow and retains its form and shape. The non-fusible portion 364 can be dimensioned to provide a standoff distance between semiconductor die 324 and substrate 370. A finish such as Cu OSP can be applied to substrate 370. Conductive trace 368 could be part of the BOL, BONL, or BONP interconnect of FIGS. 6-20.

During a reflow process, a large number (e.g., thousands) of composite bumps 362 on semiconductor die 324 are attached to interconnect sites on conductive trace 368 of substrate 370. Some of the bumps 362 may fail to properly connect to conductive trace 368, particularly if semiconductor die 324 is warped. Recall that composite bump 362 is wider than conductive trace 368. With a proper force applied, the fusible portion 366 deforms or extrudes around the top surface and side surfaces of conductive trace 368 and mechanically locks composite bump 362 to the conductive trace. The mechanical interlock is formed by nature of the fusible portion 366 being softer and more compliant than conductive trace 368 and therefore deforming around the top surface and side surfaces of the conductive trace for greater contact area. The wedge-shape of composite bump 362 increases contact area between the bump and conductive trace, e.g., along the longer aspect of FIGS. 23b and 23d, without sacrificing pitch along the shorter aspect of FIGS. 23a and 23c. The mechanical interlock between composite bump 362 and conductive trace 368 holds the bump to the conductive trace during reflow, i.e., the bump and conductive trace do not lose contact. Accordingly, composite bump 362 mating to conductive trace 368 reduces bump interconnect failures.

Figure 24A:
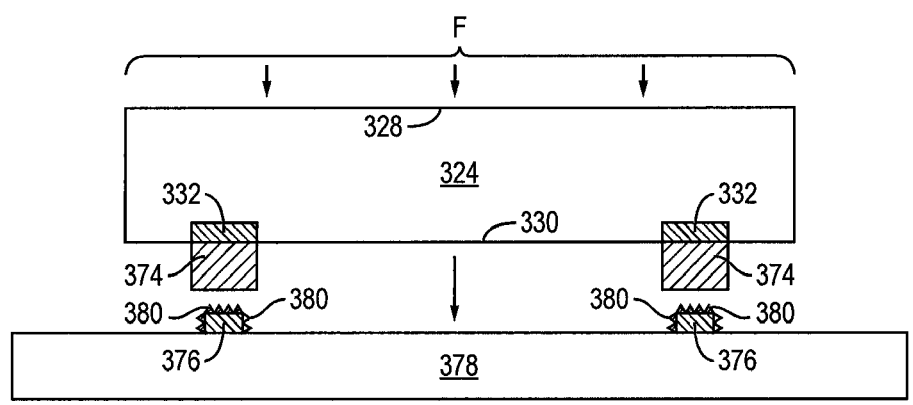
FIGS. 24a-24d illustrate another embodiment of the semiconductor die and interconnect structure bonded to the conductive traces.

FIGS. 24a-24d show a BOL embodiment of semiconductor die 324 with bump material 374 formed over contact pads 332, similar to FIG. 21c. In FIG. 24a, bump material 374 is generally compliant and undergoes plastic deformation greater than about 25 µm under a force equivalent to a vertical load of about 200 grams. Bump material 374 is wider than conductive trace 376 on substrate 378. A plurality of asperities 380 is formed on conductive trace 376 with a height on the order about 1-25 µm.

Figure 24B:
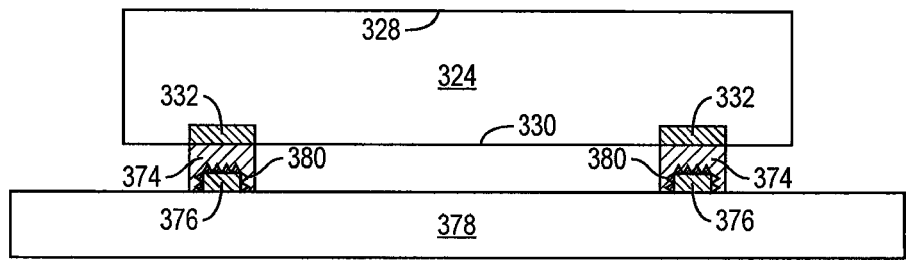

Semiconductor die 324 is positioned so that bump material 374 is aligned with an interconnect site on conductive trace 376. Alternatively, bump material 374 can be aligned with a conductive pad or other interconnect site formed on substrate 378. A pressure or force F is applied to back surface 328 of semiconductor die 324 to press bump material 374 onto conductive trace 376 and asperities 380, as shown in FIG. 24b. The force F can be applied with an elevated temperature. Due to the compliant nature of bump material 374, the bump material deforms or extrudes around the top surface and side surfaces of conductive trace 376 and asperities 380. In particular, the application of pressure causes bump material 374 to undergo a plastic deformation and cover the top surface and side surfaces of conductive trace 376 and asperities 380. The plastic flow of bump material 374 creates macroscopic mechanical interlocking points between the bump material and the top surface and side surfaces of conductive trace 376 and asperities 380. The plastic flow of bump material 374 occurs around the top surface and side surfaces of conductive trace 376 and asperities 380, but does not extend excessively onto substrate 378, which could cause electrical shorting and other defects. The mechanical interlock between the bump material and the top surface and side surfaces of conductive trace 376 and asperities 380 provides a robust connection with greater contact area between the respective surfaces, without significantly increasing the bonding force. The mechanical interlock between the bump material and the top surface and side surfaces of conductive trace 376 and asperities 380 also reduces lateral die shifting during subsequent manufacturing processes, such as encapsulation.

Figure 24C:
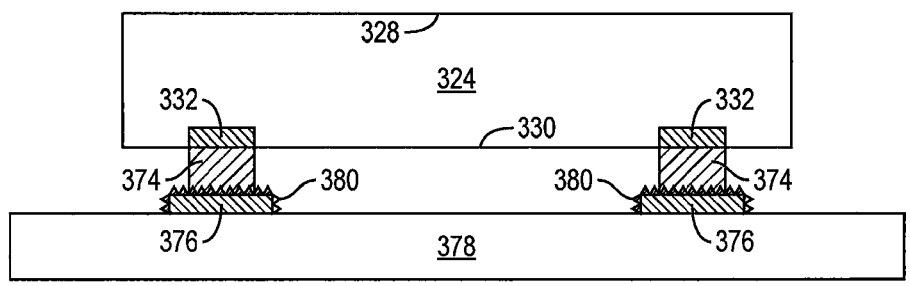

FIG. 24c shows another BOL embodiment with bump material 374 narrower than conductive trace 376. A pressure or force F is applied to back surface 328 of semiconductor die 324 to press bump material 374 onto conductive trace 376 and asperities 380. The force F can be applied with an elevated temperature. Due to the compliant nature of bump material 374, the bump material deforms or extrudes over the top surface of conductive trace 376 and asperities 380. In particular, the application of pressure causes bump material 374 to undergo a plastic deformation and cover the top surface of conductive trace 376 and asperities 380. The plastic flow of bump material 374 creates macroscopic mechanical interlocking points between the bump material and the top surface of conductive trace 376 and asperities 380. The mechanical interlock between the bump material and the top surface of conductive trace 376 and asperities 380 provides a robust connection with greater contact area between the respective surfaces, without significantly increasing the bonding force. The mechanical interlock between the bump material and the top surface of conductive trace 376 and asperities 380 also reduces lateral die shifting during subsequent manufacturing processes, such as encapsulation.

Figure 24D:
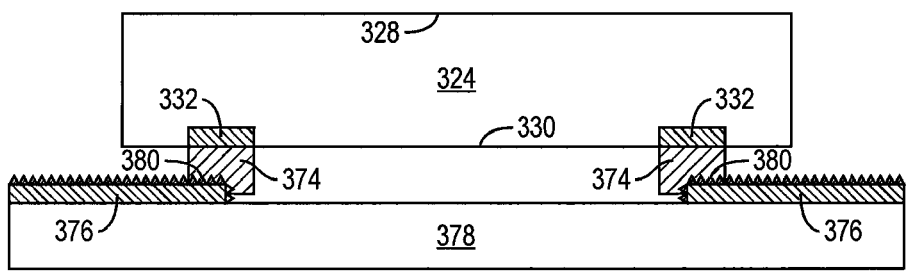

FIG. 24d shows another BOL embodiment with bump material 374 formed over an edge of conductive trace 376, i.e., part of the bump material is over the conductive trace and part of the bump material is not over the conductive trace. A pressure or force F is applied to back surface 328 of semiconductor die 324 to press bump material 374 onto conductive trace 376 and asperities 380. The force F can be applied with an elevated temperature. Due to the compliant nature of bump material 374, the bump material deforms or extrudes over the top surface and side surfaces of conductive trace 376 and asperities 380. In particular, the application of pressure causes bump material 374 to undergo a plastic deformation and cover the top surface and side surfaces of conductive trace 376 and asperities 380. The plastic flow of bump material 374 creates macroscopic mechanical interlocking between the bump material and the top surface and side surfaces of conductive trace 376 and asperities 380. The mechanical interlock between the bump material and the top surface and side surfaces of conductive trace 376 and asperities 380 provides a robust connection with greater contact area between the respective surfaces, without significantly increasing the bonding force. The mechanical interlock between the bump material and the top surface and side surfaces of conductive trace 376 and asperities 380 also reduces lateral die shifting during subsequent manufacturing processes, such as encapsulation.

Figure 25A:
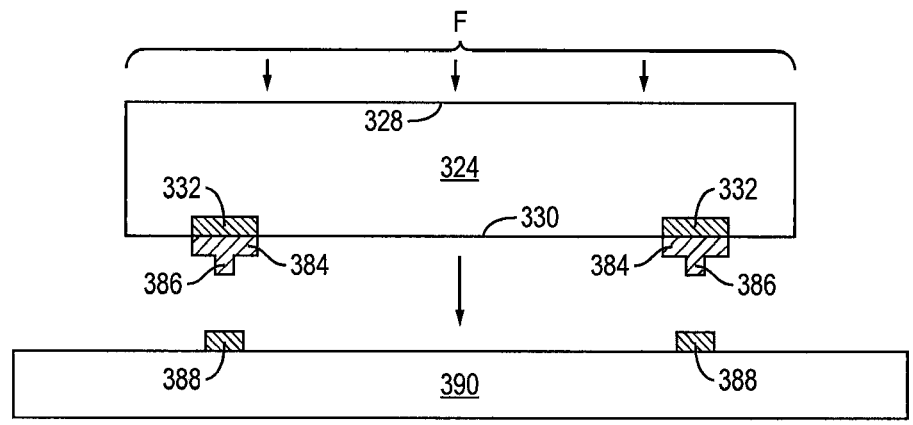
FIGS. 25a-25c illustrate stepped bump and stud bump interconnect structures bonded to the conductive traces.
Figure 25B:
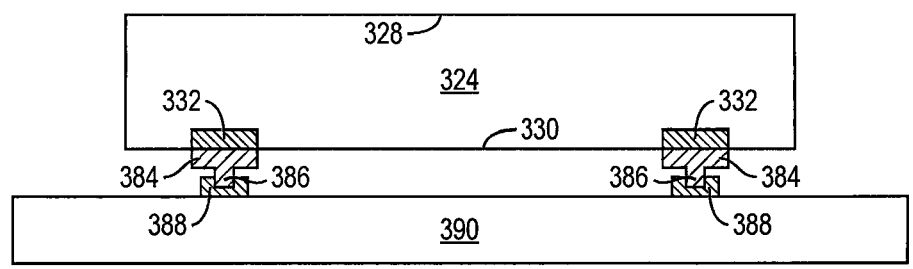
Figure 25C:
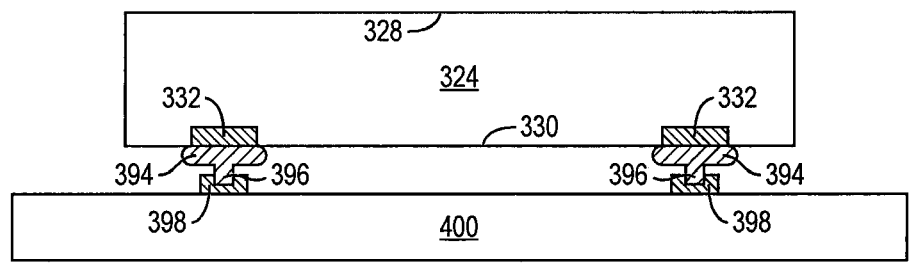

FIGS. 25a-25c show a BOL embodiment of semiconductor die 324 with bump material 384 formed over contact pads 332, similar to FIG. 21c. A tip 386 extends from the body of bump material 384 as a stepped bump with tip 386 narrower than the body of bump material 384, as shown in FIG. 25a. Semiconductor die 324 is positioned so that bump material 384 is aligned with an interconnect site on conductive trace 388 on substrate 390. More specifically, tip 386 is centered over an interconnect site on conductive trace 388. Alternatively, bump material 384 and tip 386 can be aligned with a conductive pad or other interconnect site formed on substrate 390. Bump material 384 is wider than conductive trace 388 on substrate 390.

Conductive trace 388 is generally compliant and undergoes plastic deformation greater than about 25 µm under a force equivalent to a vertical load of about 200 grams. A pressure or force F is applied to back surface 328 of semiconductor die 324 to press tip 384 onto conductive trace 388. The force F can be applied with an elevated temperature. Due to the compliant nature of conductive trace 388, the conductive trace deforms around tip 386, as shown in FIG. 25b. In particular, the application of pressure causes conductive trace 388 to undergo a plastic deformation and cover the top surface and side surfaces of tip 386.

FIG. 25c shows another BOL embodiment with rounded bump material 394 formed over contact pads 332. A tip 396 extends from the body of bump material 394 to form a stud bump with the tip narrower than the body of bump material 394. Semiconductor die 324 is positioned so that bump material 394 is aligned with an interconnect site on conductive trace 398 on substrate 400. More specifically, tip 396 is centered over an interconnect site on conductive trace 398. Alternatively, bump material 394 and tip 396 can be aligned with a conductive pad or other interconnect site formed on substrate 400. Bump material 394 is wider than conductive trace 398 on substrate 400.

Conductive trace 398 is generally compliant and undergoes plastic deformation greater than about 25 µm under a force equivalent to a vertical load of about 200 grams. A pressure or force F is applied to back surface 328 of semiconductor die 324 to press tip 396 onto conductive trace 398. The force F can be applied with an elevated temperature. Due to the compliant nature of conductive trace 398, the conductive trace deforms around tip 396. In particular, the application of pressure causes conductive trace 398 to undergo a plastic deformation and cover the top surface and side surfaces of tip 396.

The conductive traces described in FIGS. 22a-22g, 23a-23d, and 24a-24d can also be compliant material as described in FIGS. 25a-25c.

Figure 26A:
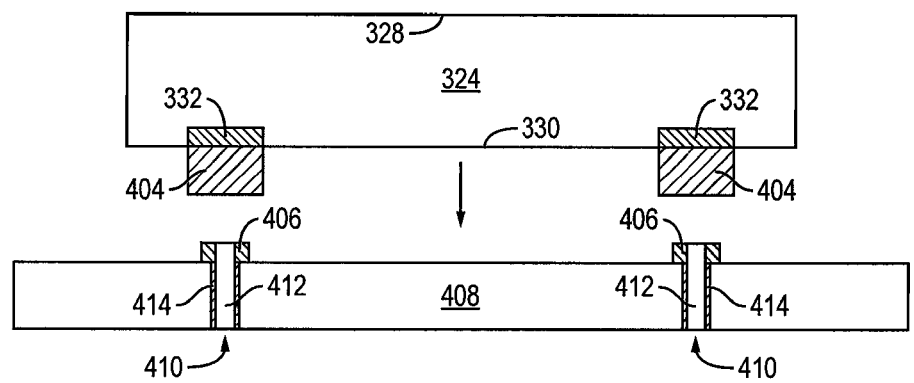
FIGS. 26a-26b illustrate conductive traces with conductive vias.
Figure 26B:
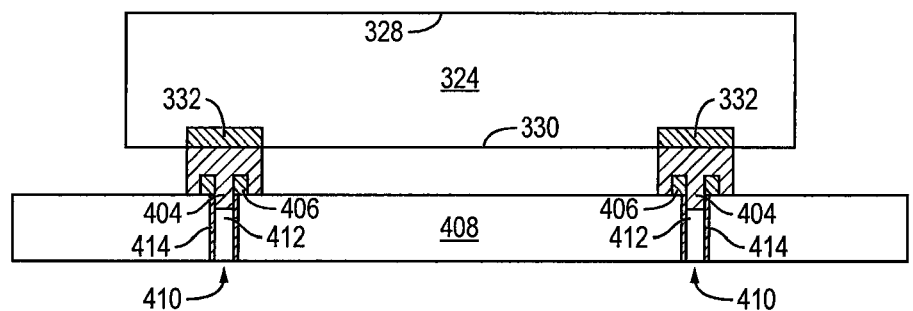

FIGS. 26a-26b show a BOL embodiment of semiconductor die 324 with bump material 404 formed over contact pads 332, similar to FIG. 21c. Bump material 404 is generally compliant and undergoes plastic deformation greater than about 25 µm under a force equivalent to a vertical load of about 200 grams. Bump material 404 is wider than conductive trace 406 on substrate 408. A conductive via 410 is formed through conductive trace 406 with an opening 412 and conductive sidewalls 414, as shown in FIG. 26a. Conductive trace 406 could be part of the BOL, BONL, or BONP interconnect of FIGS. 6-20.

Figure 30A:
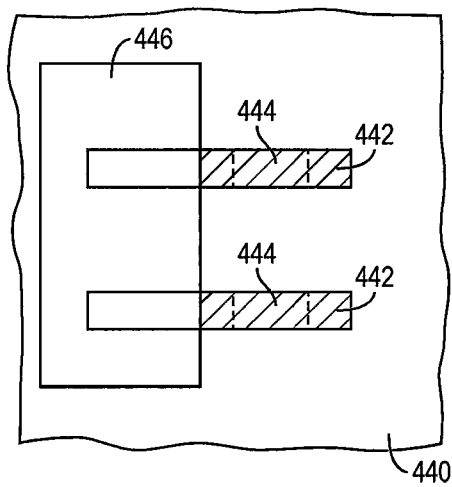
FIGS. 30a-30g illustrate various arrangements of the conductive traces with open solder registration.
Figure 30B:
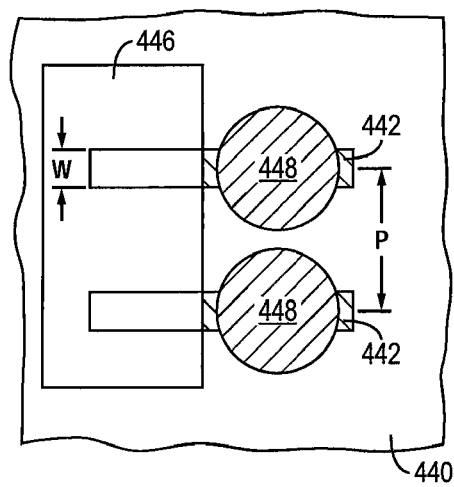
Figure 30C:
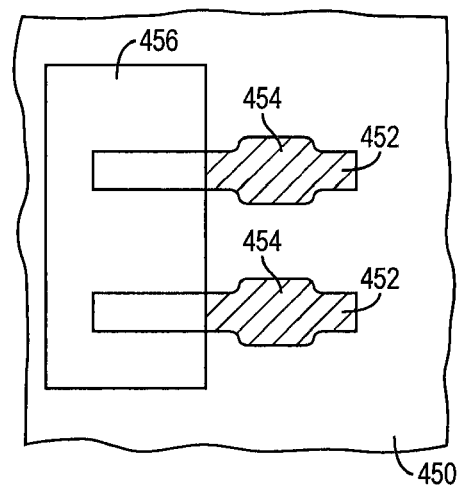
Figure 30D:
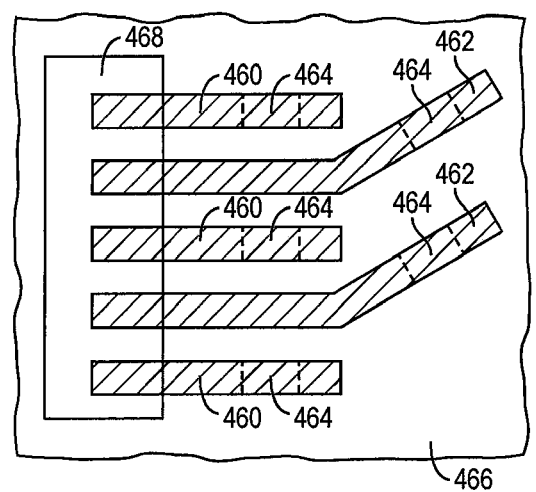
Figure 30E:
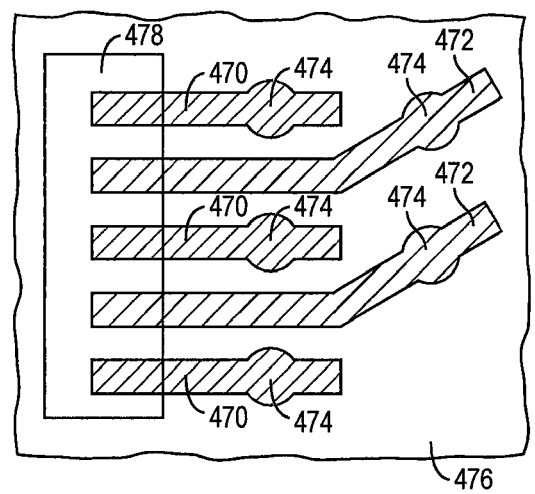
Figure 30F:
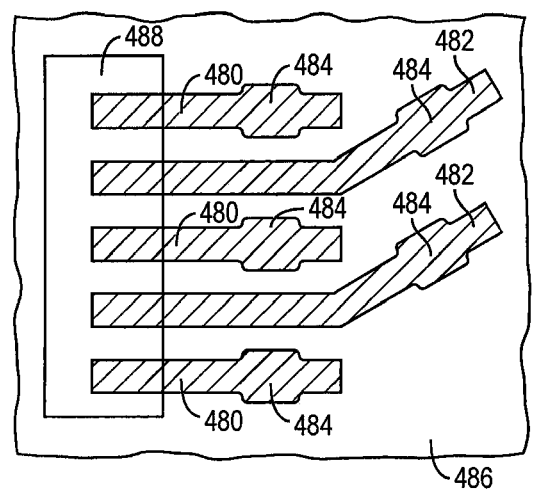
Figure 30G:
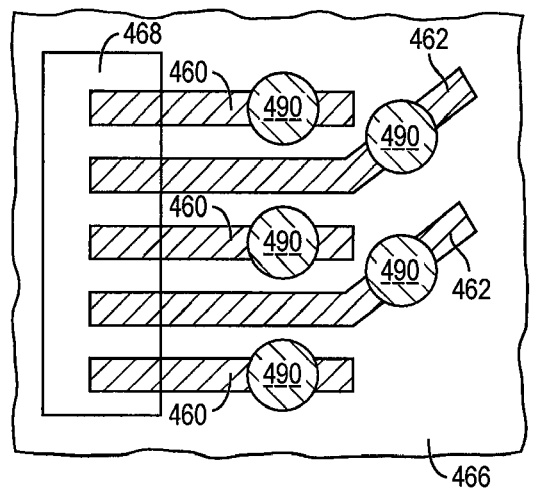

Semiconductor die 324 is positioned so that bump material 404 is aligned with an interconnect site on conductive trace 406, see FIGS. 30-30g. Alternatively, bump material 404 can be aligned with a conductive pad or other interconnect site formed on substrate 408. A pressure or force F is applied to back surface 328 of semiconductor die 324 to press bump material 404 onto conductive trace 406 and into opening 413 of conductive via 410. The force F can be applied with an elevated temperature. Due to the compliant nature of bump material 404, the bump material deforms or extrudes around the top surface and side surfaces of conductive trace 406 and into opening 412 of conductive vias 410, as shown in FIG. 26b. In particular, the application of pressure causes bump material 404 to undergo a plastic deformation and cover the top surface and side surfaces of conductive trace 406 and into opening 412 of conductive via 410. Bump material 404 is thus electrically connected to conductive trace 406 and conductive sidewalls 414 for z-direction vertical interconnect through substrate 408. The plastic flow of bump material 404 creates a mechanical interlock between the bump material and the top surface and side surfaces of conductive trace 406 and opening 412 of conductive via 410. The mechanical interlock between the bump material and the top surface and side surfaces of conductive trace 406 and opening 412 of conductive via 410 provides a robust connection with greater contact area between the respective surfaces, without significantly increasing the bonding force. The mechanical interlock between the bump material and the top surface and side surfaces of conductive trace 406 and opening 412 of conductive via 410 also reduces lateral die shifting during subsequent manufacturing processes, such as encapsulation. Since conductive via 410 is formed within the interconnect site with bump material 404, the total substrate interconnect area is reduced.

In the BOL embodiments of FIGS. 22a-22g, 23a-23d, 24a-24d, 25a-25c, and 26a-26b, by making the conductive trace narrower than the interconnect structure, the conductive trace pitch can be reduced to increase routing density and I/O count. The narrower conductive trace reduces the force F needed to deform the interconnect structure around the conductive trace. For example, the requisite force F may be 30-50% of the force needed to deform a bump against a conductive trace or pad that is wider than the bump. The lower compressive force F is useful for fine pitch interconnect and small die to maintain coplanarity within a specified tolerance and achieve uniform z-direction deformation and high reliability interconnect union. In addition, deforming the interconnect structure around the conductive trace mechanically locks the bump to the trace to prevent die shifting or die floating during reflow.

Figure 27C:
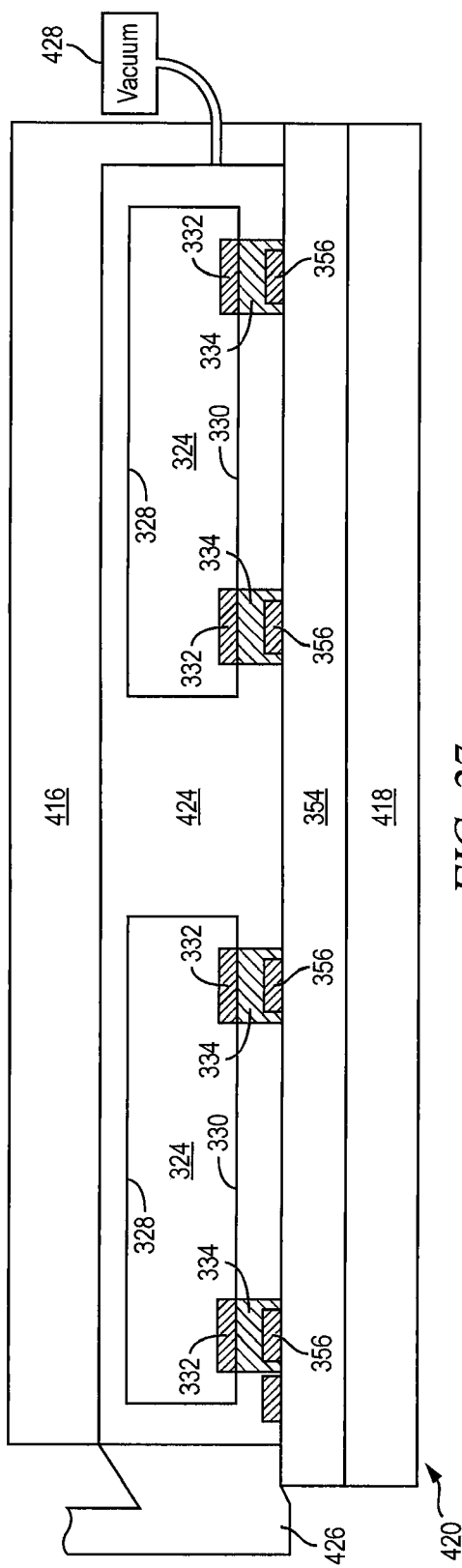

FIGS. 27a-27c show a mold underfill (MUF) process to deposit encapsulant around the bumps between the semiconductor die and substrate. FIG. 27a shows semiconductor die 324 mounted to substrate 354 using bump material 334 from FIG. 22b and placed between upper mold support 416 and lower mold support 418 of chase mold 420. The other semiconductor die and substrate combinations from FIGS. 22a-22g, 23a-23d, 24a-24d, 25a-25c, and 26a-26b can be placed between upper mold support 416 and lower mold support 418 of chase mold 420. The upper mold support 416 includes compressible releasing film 422.

In FIG. 27b, upper mold support 416 and lower mold support 418 are brought together to enclose semiconductor die 324 and substrate 354 with an open space over the substrate and between the semiconductor die and substrate. Compressible releasing film 422 conforms to back surface 328 and side surfaces of semiconductor die 324 to block formation of encapsulant on these surfaces. An encapsulant 424 in a liquid state is injected into one side of chase mold 420 with nozzle 426 while an optional vacuum assist 428 draws pressure from the opposite side to uniformly fill the open space over substrate 354 and the open space between semiconductor die 324 and substrate 354 with the encapsulant. Encapsulant 424 can be polymer composite material, such as epoxy resin with filler, epoxy acrylate with filler, or polymer with proper filler. Encapsulant 424 is non-conductive and environmentally protects the semiconductor device from external elements and contaminants. Compressible material 422 prevents encapsulant 424 from flowing over back surface 328 and around the side surfaces of semiconductor die 324. Encapsulant 424 is cured. The back surface 328 and side surfaces of semiconductor die 324 remain exposed from encapsulant 424.

FIG. 27c shows an embodiment of MUF and mold overfill (MOF), i.e., without compressible material 422. Semiconductor die 324 and substrate 354 are placed between upper mold support 416 and lower mold support 418 of chase mold 420. The upper mold support 416 and lower mold support 418 are brought together to enclose semiconductor die 324 and substrate 354 with an open space over the substrate, around the semiconductor die, and between the semiconductor die and substrate. Encapsulant 424 in a liquid state is injected into one side of chase mold 420 with nozzle 426 while an optional vacuum assist 428 draws pressure from the opposite side to uniformly fill the open space around semiconductor die 324 and over substrate 354 and the open space between semiconductor die 324 and substrate 354 with the encapsulant. Encapsulant 424 is cured.

Figure 28:
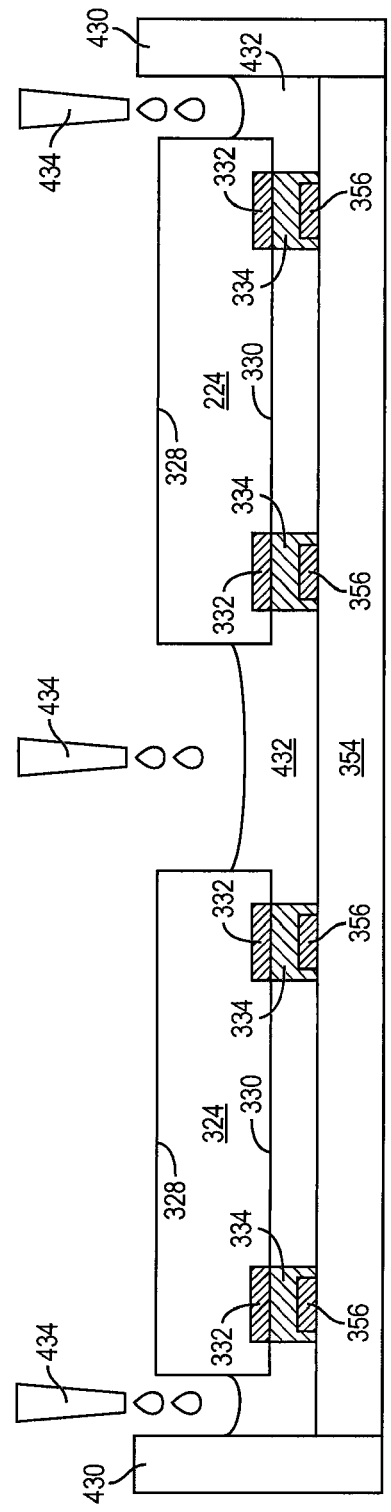
FIG. 28 illustrates another mold underfill between the semiconductor die and substrate.

FIG. 28 shows another embodiment of depositing encapsulant around semiconductor die 324 and in the gap between semiconductor die 324 and substrate 354. Semiconductor die 324 and substrate 354 are enclosed by dam 430. Encapsulant 432 is dispensed from nozzles 434 in a liquid state into dam 430 to fill the open space over substrate 354 and the open space between semiconductor die 324 and substrate 354. The volume of encapsulant 432 dispensed from nozzles 434 is controlled to fill dam 430 without covering back surface 328 or the side surfaces of semiconductor die 324. Encapsulant 432 is cured.

Figure 29:
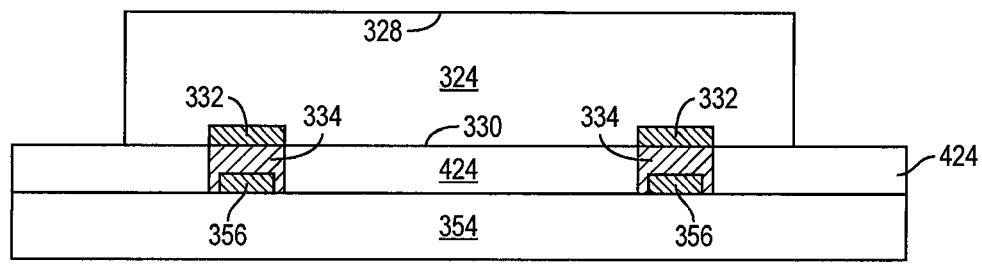
FIG. 29 illustrates the semiconductor die and substrate after mold underfill.

FIG. 29 shows semiconductor die 324 and substrate 354 after the MUF process from FIGS. 27a, 27c, and 28. Encapsulant 424 is uniformly distributed over substrate 354 and around bump material 334 between semiconductor die 324 and substrate 354.

FIGS. 30a-30g show top views of various conductive trace layouts on substrate or PCB 440. In FIG. 30a, conductive trace 442 is a straight conductor with integrated bump pad or interconnect site 444 formed on substrate 440. The sides of substrate bump pad 444 can be co-linear with conductive trace 442. In the prior art, a solder registration opening (SRO) is typically formed over the interconnect site to contain the bump material during reflow. The SRO increases interconnect pitch and reduces I/O count. In contrast, masking layer 446 can be formed over a portion of substrate 440; however, the masking layer is not formed around substrate bump pad 444 of conductive trace 442. That is, the portion of conductive trace 442 designed to mate with the bump material is devoid of any SRO of masking layer 446 that would have been used for bump containment during reflow.

Semiconductor die 324 is placed over substrate 440 and the bump material is aligned with substrate bump pads 444. The bump material is electrically and metallurgically connected to substrate bump pads 444 by bringing the bump material in physical contact with the bump pad and then reflowing the bump material under a reflow temperature.

In another embodiment, an electrically conductive bump material is deposited over substrate bump pad 444 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 444 using a suitable attachment or bonding process. In one embodiment, the bump material is reflowed by heating the material above its melting point to form bump or interconnect 448, as shown in FIG. 30b. In some applications, bump 448 is reflowed a second time to improve electrical contact to substrate bump pad 444. The bump material around the narrow substrate bump pad 444 maintains die placement during reflow.

In high routing density applications, it is desirable to minimize escape pitch of conductive traces 442. The escape pitch between conductive traces 442 can be reduced by eliminating the masking layer for the purpose of reflow containment, i.e., by reflowing the bump material without a masking layer. Since no SRO is formed around die bump pad 332 or substrate bump pad 444, conductive traces 442 can be formed with a finer pitch, i.e., conductive trace 442 can be disposed closer together or to nearby structures. With no SRO around substrate bump pad 444, the pitch between conductive traces 442 is given as P=D+PLT+W/2, wherein D is the base diameter of bump 448, PLT is die placement tolerance, and W is the width of conductive trace 442. In one embodiment, given a bump base diameter of 100 μm, PLT of 10 μm, and trace line width of 30 μm, the minimum escape pitch of conductive trace 442 is 125 μm. The maskless bump formation eliminates the need to account for the ligament spacing of masking material between adjacent openings, solder mask registration tolerance (SRT), and minimum resolvable SRO, as found in the prior art.

When the bump material is reflowed without a masking layer to metallurgically and electrically connect die bump pad 332 to substrate bump pad 444, the wetting and surface tension causes the bump material to maintain self-confinement and be retained within the space between die bump pad 332 and substrate bump pad 444 and portion of substrate 440 immediately adjacent to conductive trace 442 substantially within the footprint of the bump pads.

To achieve the desired self-confinement property, the bump material can be immersed in a flux solution prior to placement on die bump pad 332 or substrate bump pad 444 to selectively render the region contacted by the bump material more wettable than the surrounding area of conductive traces 442. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 440 is not needed around die bump pad 332 or substrate bump pad 444.

FIG. 30c shows another embodiment of parallel conductive traces 452 as a straight conductor with integrated rectangular bump pad or interconnect site 454 formed on substrate 450. In this case, substrate bump pad 454 is wider than conductive trace 452, but less than the width of the mating bump. The sides of substrate bump pad 454 can be parallel to conductive trace 452. Masking layer 456 can be formed over a portion of substrate 450; however, the masking layer is not formed around substrate bump pad 454 of conductive trace 452. That is, the portion of conductive trace 452 designed to mate with the bump material is devoid of any SRO of masking layer 456 that would have been used for bump containment during reflow.

FIG. 30d shows another embodiment of conductive traces 460 and 462 arranged in an array of multiple rows with offset integrated bump pad or interconnect site 464 formed on substrate 466 for maximum interconnect density and capacity. Alternate conductive traces 460 and 462 include an elbow for routing to bump pads 464. The sides of each substrate bump pad 464 is co-linear with conductive traces 460 and 462. Masking layer 468 can be formed over a portion of substrate 466; however, masking layer 468 is not formed around substrate bump pad 464 of conductive traces 460 and 462. That is, the portion of conductive trace 460 and 462 designed to mate with the bump material is devoid of any SRO of masking layer 468 that would have been used for bump containment during reflow.

FIG. 30e shows another embodiment of conductive traces 470 and 472 arranged in an array of multiple rows with offset integrated bump pad or interconnect site 474 formed on substrate 476 for maximum interconnect density and capacity. Alternate conductive traces 470 and 472 include an elbow for routing to bump pads 474. In this case, substrate bump pad 474 is rounded and wider than conductive traces 470 and 472, but less than the width of the mating interconnect bump material. Masking layer 478 can be formed over a portion of substrate 476; however, masking layer 478 is not formed around substrate bump pad 474 of conductive traces 470 and 472. That is, the portion of conductive trace 470 and 472 designed to mate with the bump material is devoid of any SRO of masking layer 478 that would have been used for bump containment during reflow.

FIG. 30f shows another embodiment of conductive traces 480 and 482 arranged in an array of multiple rows with offset integrated bump pad or interconnect site 484 formed on substrate 486 for maximum interconnect density and capacity. Alternate conductive traces 480 and 482 include an elbow for routing to bump pads 484. In this case, substrate bump pad 484 is rectangular and wider than conductive traces 480 and 482, but less than the width of the mating interconnect bump material. Masking layer 488 can be formed over a portion of substrate 486; however, masking layer 488 is not formed around substrate bump pad 484 of conductive traces 480 and 482. That is, the portion of conductive trace 480 and 482 designed to mate with the bump material is devoid of any SRO of masking layer 488 that would have been used for bump containment during reflow.

As one example of the interconnect process, semiconductor die 324 is placed over substrate 466 and bump material 334 is aligned with substrate bump pads 464 from FIG. 30d. Bump material 334 is electrically and metallurgically connected to substrate bump pad 464 by pressing the bump material or by bringing the bump material in physical contact with the bump pad and then reflowing the bump material under a reflow temperature, as described for FIGS. 22a-22g, 23a-23d, 24a-24d, 25a-25c, and 26a-26b.

In another embodiment, an electrically conductive bump material is deposited over substrate bump pad 464 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to substrate bump pad 464 using a suitable attachment or bonding process. In one embodiment, the bump material is reflowed by heating the material above its melting point to form bump or interconnect 490, as shown in FIG. 30g. In some applications, bump 490 is reflowed a second time to improve electrical contact to substrate bump pad 464. The bump material around the narrow substrate bump pad 464 maintains die placement during reflow. Bump material 334 or bumps 490 can also be formed on substrate bump pad configurations of FIGS. 30a-30g.

In high routing density applications, it is desirable to minimize escape pitch of conductive traces 460 and 462 or other conductive trace configurations of FIGS. 30a-30g. The escape pitch between conductive traces 460 and 462 can be reduced by eliminating the masking layer for the purpose of reflow containment, i.e., by reflowing the bump material without a masking layer. Since no SRO is formed around die bump pad 332 or substrate bump pad 464, conductive traces 460 and 462 can be formed with a finer pitch, i.e., conductive traces 460 and 462 can be disposed closer together or to nearby structures. With no SRO around substrate bump pad 464, the pitch between conductive traces 460 and 462 is given as P=D/2+PLT+W/2, wherein D is the base diameter of bump 490, PLT is die placement tolerance, and W is the width of conductive traces 460 and 462. In one embodiment, given a bump base diameter of 100 μm, PLT of 10 μm, and trace line width of 30 μm, the minimum escape pitch of conductive traces 460 and 462 is 125 μm. The mask-less bump formation eliminates the need to account for the ligament spacing of masking material between adjacent openings, SRT, and minimum resolvable SRO, as found in the prior art.

When the bump material is reflowed without a masking layer to metallurgically and electrically connect die bump pad 332 to substrate bump pad 464, the wetting and surface tension causes the bump material to maintain self-confinement and be retained within the space between die bump pad 332 and substrate bump pad 464 and portion of substrate 466 immediately adjacent to conductive traces 460 and 462 substantially within the footprint of the bump pads.

To achieve the desired self-confinement property, the bump material can be immersed in a flux solution prior to placement on die bump pad 332 or substrate bump pad 464 to selectively render the region contacted by the bump material more wettable than the surrounding area of conductive traces 460 and 462. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 468 is not needed around die bump pad 332 or substrate bump pad 464.

Figure 31A:
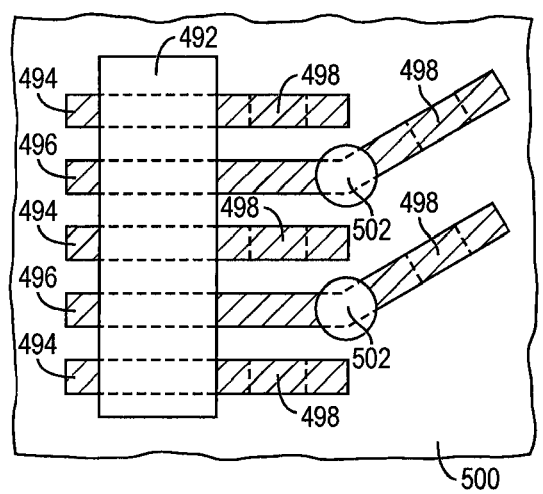
FIGS. 31a-31b illustrate the open solder registration with patches between the conductive traces.
Figure 31B:
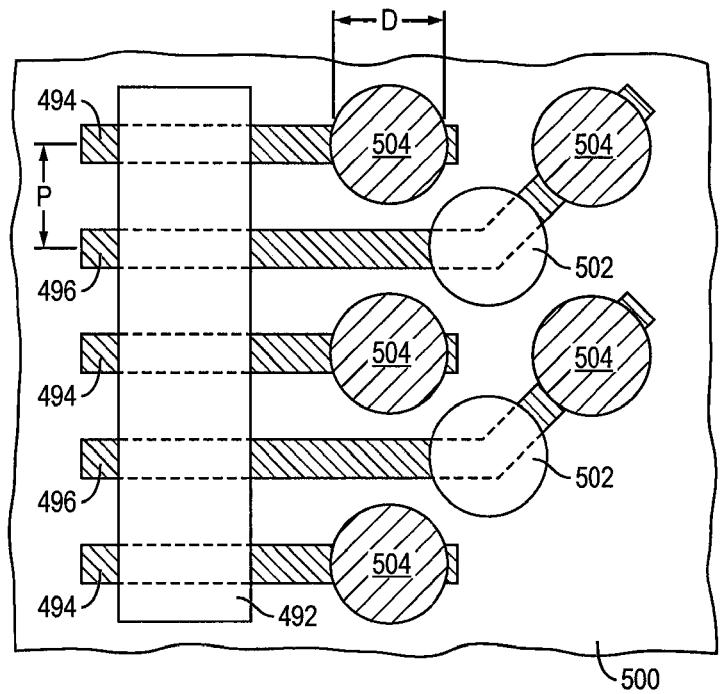

In FIG. 31a, masking layer 492 is deposited over a portion of conductive traces 494 and 496. However, masking layer 492 is not formed over integrated bump pads 498. Consequently, there is no SRO for each bump pad 498 on substrate 500. A non-wettable masking patch 502 is formed on substrate 500 interstitially within the array of integrated bump pads 498, i.e., between adjacent bump pads. The masking patch 502 can also be formed on semiconductor die 324 interstitially within the array of die bump pads 498. More generally, the masking patch is formed in close proximity to the integrated bump pads in any arrangement to prevent run-out to less wettable areas.

Semiconductor die 324 is placed over substrate 500 and the bump material is aligned with substrate bump pads 498. The bump material is electrically and metallurgically connected to substrate bump pad 498 by pressing the bump material or by bringing the bump material in physical contact with the bump pad and then reflowing the bump material under a reflow temperature, as described for FIGS. 22a-22g, 23a-23d, 24a-24d, 25a-25c, and 26a-26b.

In another embodiment, an electrically conductive bump material is deposited over die integrated bump pads 498 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to integrated bump pads 498 using a suitable attachment or bonding process. In one embodiment, the bump material is reflowed by heating the material above its melting point to form spherical balls or bumps 504. In some applications, bumps 504 are reflowed a second time to improve electrical contact to integrated bump pads 498. The bumps can also be compression bonded to integrated bump pads 498. Bumps 504 represent one type of interconnect structure that can be formed over integrated bump pads 498. The interconnect structure can also use stud bump, micro bump, or other electrical interconnect.

In high routing density applications, it is desirable to minimize escape pitch. In order to reduce the pitch between conductive traces 494 and 496, the bump material is reflowed without a masking layer around integrated bump pads 498. The escape pitch between conductive traces 494 and 496 can be reduced by eliminating the masking layer and associated SROs around the integrated bump pads for the purpose of reflow containment, i.e., by reflowing the bump material without a masking layer. Masking layer 492 can be formed over a portion of conductive traces 494 and 496 and substrate 400 away from integrated bump pads 498; however, masking layer 492 is not formed around integrated bump pads 498. That is, the portion of conductive trace 494 and 496 designed to mate with the bump material is devoid of any SRO of masking layer 392 that would have been used for bump containment during reflow.

In addition, masking patch 502 is formed on substrate 500 interstitially within the array of integrated bump pads 498. Masking patch 502 is non-wettable material. Masking patch 502 can be the same material as masking layer 492 and applied during the same processing step, or a different material during a different processing step. Masking patch 502 can be formed by selective oxidation, plating, or other treatment of the portion of the trace or pad within the array of integrated bump pads 498. Masking patch 502 confines bump material flow to integrated bump pads 498 and prevents leaching of conductive bump material to adjacent structures.

When the bump material is reflowed with masking patch 502 interstitially disposed within the array of integrated bump pads 498, the wetting and surface tension causes the bump material to be confined and retained within the space between die bump pads 332 and integrated bump pads 498 and portion of substrate 500 immediately adjacent to conductive traces 494 and 496 and substantially within the footprint of the integrated bump pads 498.

To achieve the desired confinement property, the bump material can be immersed in a flux solution prior to placement on die bump pads 332 or integrated bump pads 498 to selectively render the region contacted by the bump material more wettable than the surrounding area of conductive traces 494 and 496. The molten bump material remains confined substantially within the area defined by the bump pads due to the wettable properties of the flux solution. The bump material does not run-out to the less wettable areas. A thin oxide layer or other insulating layer can be formed over areas where bump material is not intended to make the area less wettable. Hence, masking layer 492 is not needed around die bump pads 332 or integrated bump pads 498.

Since no SRO is formed around die bump pads 332 or integrated bump pads 498, conductive traces 494 and 496 can be formed with a finer pitch, i.e., the conductive traces can be disposed closer to adjacent structures without making contact and forming electrical shorts. Assuming the same solder registration design rule, the pitch between conductive traces 494 and 496 is given as P=(1.1D+W)/2, where D is the base diameter of bump 404 and W is the width of conductive traces 494 and 496. In one embodiment, given a bump diameter of 100 μm and trace line width of 20 μm, the minimum escape pitch of conductive traces 494 and 496 is 65 μm. The bump formation eliminates the need to account for the ligament spacing of masking material between adjacent openings and minimum resolvable SRO, as found in the prior art.

Figure 32:
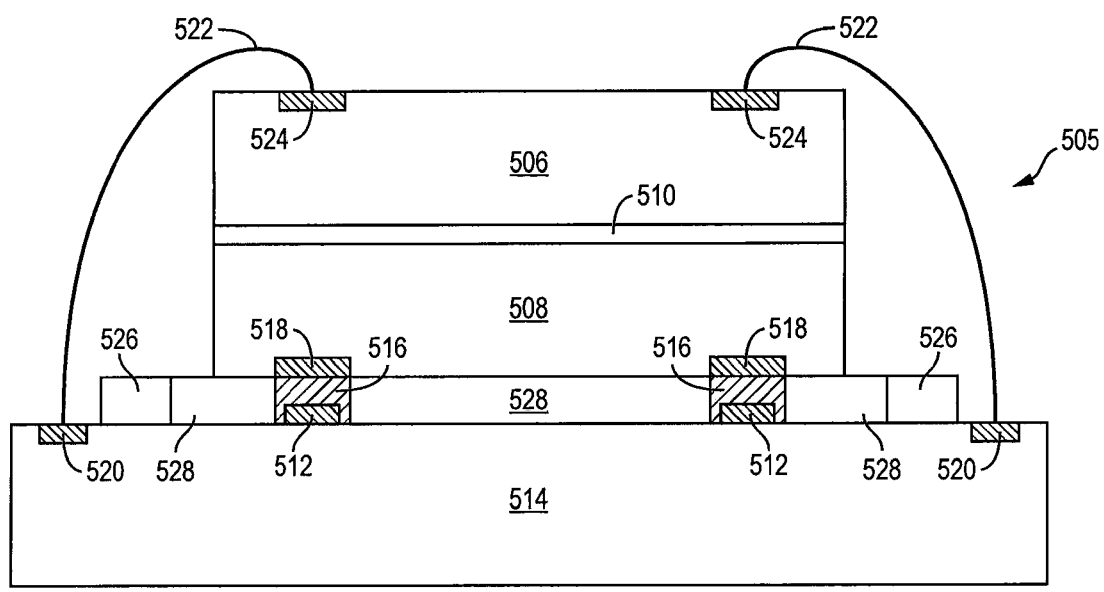
FIG. 32 illustrates a POP with masking layer dam to restrain the encapsulant during mold underfill.

FIG. 32 shows package-on-package (PoP) 505 with semiconductor die 506 stacked over semiconductor die 508 using die attach adhesive 510. Semiconductor die 506 and 508 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 506 and 508 may also contain IPDs, such as inductors, capacitors, and resistors, for RF signal processing.

Semiconductor die 506 is mounted to conductive traces 512 formed on substrate 514 using bump material 516 formed on contact pads 518, using any of the embodiments from FIGS. 22a-22g, 23a-23d, 24a-24d, 25a-25c, and 26a-26b. Conductive trace 512 could be part of the BOL or BONP interconnect of FIGS. 6-20. Semiconductor die 508 is electrically connected to contact pads 520 formed on substrate 514 using bond wires 522. The opposite end of bond wire 522 is bonded to contact pads 524 on semiconductor die 506.

Masking layer 526 is formed over substrate 514 and opened beyond the footprint of semiconductor die 506. While masking layer 526 does not confine bump material 516 to conductive traces 512 during reflow, the open mask can operate as a dam to prevent encapsulant 528 from migrating to contact pads 520 or bond wires 522 during MUF. Encapsulant 528 is deposited between semiconductor die 508 and substrate 514, similar to FIGS. 27a-27c. Masking layer 526 blocks MUF encapsulant 528 from reaching contact pads 520 and bond wires 522, which could cause a defect. Masking layer 526 allows a larger semiconductor die to be placed on a given substrate without risk of encapsulant 528 bleeding onto contact pads 520.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a first substrate;
    providing a second substrate including a conductive trace; and
    forming an interconnect structure in contact with a contact pad on the first substrate and an interconnect site of the conductive trace, wherein a width of the interconnect structure across the interconnect site is less than a length of the interconnect structure along the interconnect site, and the width of the interconnect structure is tapered along the length of the interconnect structure to be wider proximate to the first substrate and narrower proximate to the interconnect site.

2. The method of claim 1, wherein the first substrate includes a semiconductor die.

3. The method of claim 1, wherein the width of the interconnect site is less than 120% of a width of the conductive trace.

4. The method of claim 1, wherein the interconnect site includes a generally rectangular or elongated shape.

5. The method of claim 1, wherein the interconnect structure includes a non-fusible portion and a fusible portion extending from the non-fusible portion.

6. The method of claim 1, further including depositing an underfill material between the first substrate and second substrate.

7. The method of claim 1, further including forming the interconnect structure over an end portion of the conductive trace or an intermediate portion of the conductive trace.

8. A method of making a semiconductor device, comprising:
    providing a semiconductor component including a contact pad;
    providing a substrate including a conductive trace; and
    disposing an interconnect structure including a non-fusible portion and a fusible portion extending from the non-fusible portion between the contact pad and a widened portion of the conductive trace along an intermediate length of the conductive trace, wherein the fusible portion of the interconnect structure extends over a side surface of the conductive trace, and a width of the interconnect structure is tapered along the length of the interconnect structure to be wider proximate to the semiconductor component and narrower proximate to the conductive trace.

9. The method of claim 8, wherein a width of the widened portion of the conductive trace is less than 80% of a width of a contact interface between the interconnect structure and the contact pad.

10. The method of claim 8, wherein a width of the widened portion of the conductive trace is less than 120% of a width of the conductive trace.

11. The method of claim 8, further including forming a non-wettable masking patch over the substrate proximate to and physically separated from the conductive trace.

12. The method of claim 8, wherein the widened portion of the conductive trace includes a generally rectangular or elongated shape.

13. The method of claim 8, wherein a width of the interconnect structure across the widened portion of the conductive trace is less than a length of the interconnect structure along the widened portion of the conductive trace.

14. A method of making a semiconductor device, comprising:
    forming a conductive pad over a semiconductor component;
    forming a conductive trace over a substrate; and
    forming an interconnect structure between the conductive pad and an interconnect site on the conductive trace, wherein a length of the interconnect site along an intermediate portion of the conductive trace is greater than a width of a contact interface between the interconnect structure and conductive pad, and a width of the interconnect structure is tapered along the length of the interconnect structure to be wider proximate to the semiconductor component and narrower proximate to the conductive trace.

15. The method of claim 14, wherein a width of the interconnect site is less than 120% of a width of the conductive trace.

16. The method of claim 14, wherein the interconnect site includes a generally rectangular or elongated shape.

17. The method of claim 14, wherein the interconnect structure includes a non-fusible portion and a fusible portion extending from the non-fusible portion.

18. The method of claim 14, wherein a width of the interconnect site is less than 80% of a width of a contact interface between the interconnect structure and the conductive pad.

19. The method of claim 14, further including forming a non-wettable masking patch over the substrate proximate to and physically separated from the conductive trace.

* * * * *